United States Patent  (10) Patent No.: US 10,522,561 B2
Zhang et al.  (45) Date of Patent: Dec. 31, 2019

(54) METHOD FOR FORMING A THREE-DIMENSIONAL MEMORY DEVICE

(71) Applicant: Yangtze Memory Technologies Co., Ltd., Wuhan, Hubei (CN)

(72) Inventors: Kun Zhang, Hubei (CN); Fandong Liu, Hubei (CN); Zhiliang Xia, Hubei (CN)

(73) Assignee: Yangtze Memory Technologies Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/047,178

(22) Filed: Jul. 27, 2018

(65) Prior Publication Data

US 2019/0067324 A1 Feb. 28, 2019

Related U.S. Application Data

(63) Continuation of application No. PCT/CN2018/093532, filed on Jun. 29, 2018.

(30) Foreign Application Priority Data

Aug. 23, 2017 (CN) .......................... 2017 1 0728015

(51) Int. Cl.
*H01L 27/11582* (2017.01)
*H01L 27/11556* (2017.01)
(Continued)

(52) U.S. Cl.
CPC ........ *H01L 27/11582* (2013.01); *H01L 21/77* (2013.01); *H01L 27/1157* (2013.01);
(Continued)

(58) Field of Classification Search
CPC ....... H01L 25/065–0657; H01L 25/105; H01L 25/16–167; H01L 25/18; H01L 25/043;
(Continued)

(56) References Cited

U.S. PATENT DOCUMENTS 7,679,125 B2 3/2010 Swift et al.
9,309,106 B2 4/2016 Boysel et al.
(Continued)

FOREIGN PATENT DOCUMENTS

CN 101179037 A 5/2008
CN 101232038 A 7/2008
(Continued)

OTHER PUBLICATIONS

International Search Report and Written Opinion of the International Searching Authority directed to related International Patent Application No. PCT/CN2018/093532, dated Sep. 26, 2018; 7 pages.

*Primary Examiner* — Scott B Geyer
(74) *Attorney, Agent, or Firm* — Sterne, Kessler, Goldstein & Fox P.L.L.C.

(57) ABSTRACT

Embodiments of a method for forming a three-dimensional (3D) memory devices are disclosed. The method can comprise forming a device wafer including: forming a first channel hole penetrating a first alternating layer stack of a device wafer, forming an epitaxial layer on a bottom of the first channel hole, and forming a first channel layer on a sidewall of the first channel hole. The method can further comprise forming at least one connecting wafer, each connecting wafer including a second channel hole penetrating a second alternating layer stack without an epitaxial layer on a bottom of the second channel hole; and bonding the at least one connecting wafer and the device wafer, such that a second channel layer on a sidewall of the second channel hole in each connecting wafer is electrically connected with the first channel layer in the device wafer.

20 Claims, 47 Drawing Sheets

(51) Int. Cl.
  *H01L 21/77*    (2017.01)
  *H01L 27/11568* (2017.01)
  *H01L 27/11521* (2017.01)
  *H01L 27/1157*  (2017.01)
  *H01L 27/11529* (2017.01)
  *H01L 27/11524* (2017.01)

(52) U.S. Cl.
  CPC .. *H01L 27/11521* (2013.01); *H01L 27/11556* (2013.01); *H01L 27/11568* (2013.01); *H01L 27/11524* (2013.01); *H01L 27/11529* (2013.01)

(58) Field of Classification Search
  CPC .............. H01L 25/0657; H01L 25/074; H01L 25/0756; H01L 25/117; H01L 27/11582; H01L 27/11556
  See application file for complete search history.

(56) References Cited

U.S. PATENT DOCUMENTS

| | | |
|---|---|---|
| 2010/0207227 A1 | 8/2010 | Meyer-Berg |
| 2010/0230724 A1 | 9/2010 | Sinha et al. |
| 2015/0054149 A1 | 2/2015 | Purushothaman et al. |
| 2015/0076586 A1 | 3/2015 | Rabkin et al. |
| 2015/0340316 A1 | 11/2015 | Or-Bach et al. |
| 2016/0183391 A1 | 6/2016 | Kunard et al. |

FOREIGN PATENT DOCUMENTS

| | | |
|---|---|---|
| CN | 101416281 A | 4/2009 |
| WO | WO-2016/112463 A1 | 7/2016 |

METHOD FOR FORMING A THREE-DIMENSIONAL MEMORY DEVICE

CROSS-REFERENCE TO RELATED APPLICATIONS

This application claims priority to PCT/CN2018/093532 filed on Jun. 29, 2018, which claims priority to Chinese Patent Application No. 201710728015.3 filed on Aug. 23, 2017, the entire contents of which are incorporated herein by reference.

TECHNICAL FIELD

The present disclosure generally relates to the field of semiconductor technology, and more particularly, to a method for forming a three-dimensional (3D) memory device.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

As semiconductor technology advances, 3D memory devices, such as 3D NAND memory devices, keep scaling more oxide/nitride (ON) layers. As a result, etching processes of channel holes become more and more challenging.

BRIEF SUMMARY

Embodiments of a method for forming a three-dimensional (3D) memory device are disclosed herein.

Disclosed is a method for forming a channel hole structure in a three-dimensional (3D) memory device. The method comprises forming a device wafer including: forming a first channel hole penetrating a first alternating layer stack of a device wafer, forming an epitaxial layer on a bottom of the first channel hole, and forming a first channel layer on a sidewall of the first channel hole. The method further comprises forming at least one connecting wafer, wherein each connecting wafer includes a second channel hole penetrating a second alternating layer stack without an epitaxial layer on a bottom of the second channel hole; and bonding the at least one connecting wafer and the device wafer, such that a second channel layer on a sidewall of the second channel hole in each connecting wafer is electrically connected with the first channel layer in the device wafer.

The method further comprises: forming a first interconnect surface including a top surface of a first channel connection structure on the device wafer, a width of the first channel connection structure being larger than a thickness of the first channel layer; forming a second interconnect surface including a top surface of a second channel connection structure on the connecting wafer, a width of the second channel connection structure being larger than a thickness of the second channel layer; and bonding a first connecting wafer and the device wafer, including: aligning the first channel connection structure of the device wafer and the second channel connection structure of the first connecting wafer, and bonding the first interconnect surface of the device wafer to the second interconnect surface of the first connecting wafer such that the first channel connection structure is in direct contact with the second channel connection structure.

In some embodiments, forming the device wafer further comprises: forming a first alternating dielectric stack and a first insulating connection layer on a first substrate; forming the first channel hole penetrating the first insulating connection layer and the first alternating dielectric stack; after forming the epitaxial layer on a bottom of the first channel hole, forming a first functional layer to cover a sidewall of the first channel hole; forming the first channel layer covering the first functional layer and in contact with the epitaxial layer; and forming the first channel connection structure above the first functional layer, the first channel connection structure being in contact with the first channel layer.

In some embodiments, forming the first functional layer comprises: forming a first barrier layer on the sidewall of the first channel hole for blocking an outflow of electronic charges; forming a first storage layer on a surface of the first barrier layer for storing electronic charges during operation of the 3D memory device; and forming a first tunneling layer on a surface of the first storage layer for tunneling electronic charges.

In some embodiments, forming the first channel connection structure comprises: forming a first channel connection layer on the first insulating connection layer, the first channel connection layer being in contact with the first channel layer; forming a first filling structure to fill the first channel hole; and patterning the first channel connection layer to remove a portion of the first channel connection layer to expose the first storage layer, the remaining portion of the first channel connection layer that is above the first tunneling layer and the first channel layer being the first channel connection structure.

In some embodiments, forming the first interconnect surface comprises: after patterning the first channel connection layer, removing an upper portion of the first storage layer; and refilling the first insulation connection layer and the first filling structure, such that top surfaces of the first insulation connection layer and the first filling structure are in level with the top surface of the first channel connection structure.

In some embodiments, forming each connecting wafer comprises: forming a second alternating dielectric stack on a second substrate; forming the second channel hole penetrating the second alternating dielectric stack; forming a second functional layer to cover a sidewall of the second channel hole; forming the second channel layer covering the second functional layer; forming a second filling structure to fill the second channel hole; and forming the second channel connection structure above the second functional layer, the second channel connection structure being in contact with the second channel layer.

In some embodiments, forming the first alternating dielectric stack or forming the second alternating dielectric stack comprises: forming a plurality of dielectric layer pairs stacked in a vertical direction, wherein each dielectric layer pair includes a first dielectric layer and a second dielectric layer that is different from the first dielectric layer.

In some embodiments, forming the second functional layer comprises: forming a second barrier layer on the sidewall of the second channel hole for blocking an outflow of electronic charges; forming a second storage layer on a surface of the second barrier layer for storing electronic charges during operation of the 3D memory device; and forming a second tunneling layer on a surface of the second storage layer for tunneling electronic charges.

In some embodiments, forming each connecting wafer further comprises: before forming the second channel connection structure, removing an upper portion of the first storage layer; and forming a second insulation connection layer to cover top surfaces of the second alternating dielectric stack and the second functional layer.

In some embodiments, forming the second channel connection structure comprises: forming a second channel connection layer on the second insulating connection layer, the second channel connection layer being in contact with the second channel layer and insulated with the second storage layer; and patterning the second channel connection layer to remove a portion of the second channel connection layer, the remaining portion of the second channel connection layer that is above the second tunneling layer and the second channel layer being the second channel connection structure.

In some embodiments, bonding the first connecting wafer and the device wafer further comprises: aligning and bonding one connecting wafer and the device wafer in a face-to-face manner to form a bonded structure; removing a portion of the bonded structure including the second substrate to expose the second channel layer and the second filling structure; and forming a channel plug on the second filling structure, the channel plug being in contact with the second channel layer.

In some embodiments, forming the channel plug comprises: removing a portion of the second filling structure to form a recess; forming a channel plug in the recess; and planarizing the channel plug.

In some embodiments, bonding the at least one connecting wafer and the device wafer further comprises: aligning and bonding the first connecting wafer and the device wafer in a face-to-face manner to form a two-deck bonded structure; removing a portion of the two-deck bonded structure including the second substrate to expose the second channel layer; forming a third channel connection structure in contact with the second channel layer, a width of the third channel connection structure being larger than the thickness of the second channel layer; and forming a third interconnect surface of the two-deck structure including a top surface of the third channel connection structure.

In some embodiments, bonding the at least one connecting wafer and the device wafer further comprises: aligning and bonding a second connecting wafer and the two-deck bonded structure in a face-to-face manner to form a three-deck bonded structure, such that the second channel connection structure in the second connecting wafer is in contact with the third channel connection structure in the two-deck structure.

Another aspect of the present disclosure provides a three-dimensional (3D) memory device, comprising: a lower portion including: a first alternating layer stack on a substrate, a first channel hole penetrating the first alternating layer stack, an epitaxial layer on a bottom of the first channel hole, a first channel layer on a sidewall of the first channel hole and in contact with the epitaxial layer, and a first channel connection structure in contact with the first channel layer; and a first upper portion including: a second channel hole penetrating a second alternating layer stack, a second channel layer on a sidewall of the second channel hole, and a second channel connection structure in contact with the second channel layer; wherein the first channel connection structure is bonded with the second channel connection structure.

In some embodiments, at least one of the first alternating dielectric stack and the second alternating dielectric stack comprises: a plurality of dielectric layer pairs stacked in a vertical direction, wherein each dielectric layer pair includes a first dielectric layer and a second dielectric layer that is different from the first dielectric layer.

In some embodiments, a width of the first channel connection structure is larger than a thickness of the first channel layer; a width of the second channel connection structure is larger than a thickness of the second channel layer; and the first channel connection structure is in direct contact with the second channel connection structure.

In some embodiments, the lower portion further comprises: a first functional layer covering a sidewall of the first channel hole; and a first filling structure in the first channel hole; wherein the first channel layer is sandwiched between the first functional layer and the first filling structure, and in contact with the first channel connection structure.

In some embodiments, the first functional layer comprises: a first barrier layer on the sidewall of the first channel hole and configured to block an outflow of electronic charges; a first storage layer on a surface of the first barrier layer and configured to store electronic charges during operation of the 3D memory device; and a first tunneling layer on a surface of the first storage layer and configured to tunnel electronic charges.

In some embodiments, the first upper portion comprises: a second functional layer covering a sidewall of the second channel hole; and a second filling structure filling the second channel hole; wherein the second channel layer is sandwiched between the second functional layer and the second filling structure, and in contact with the second channel connection structure.

In some embodiments, the second functional layer comprises: a second barrier layer on the sidewall of the second channel hole and configured to block an outflow of electronic charges; a second storage layer on a surface of the second barrier layer and configured to store electronic charges during operation of the 3D memory device; and a second tunneling layer on a surface of the second storage layer and configured to tunnel electronic charges.

In some embodiments, the first upper portion further includes a channel plug in the recess in contact with the second channel layer.

In some embodiments, the first upper portion further includes a third channel connection structure in contact with the second channel layer.

In some embodiments, the device further comprises: a second upper portion including: a third channel hole penetrating a third alternating layer stack, a third channel layer on a sidewall of the third channel hole, and a fourth channel connection structure in contact with the second channel layer; wherein the first upper portion is sandwiched between the second upper portion and the lower portion, and the fourth channel connection structure is bonded with the third channel connection structure.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
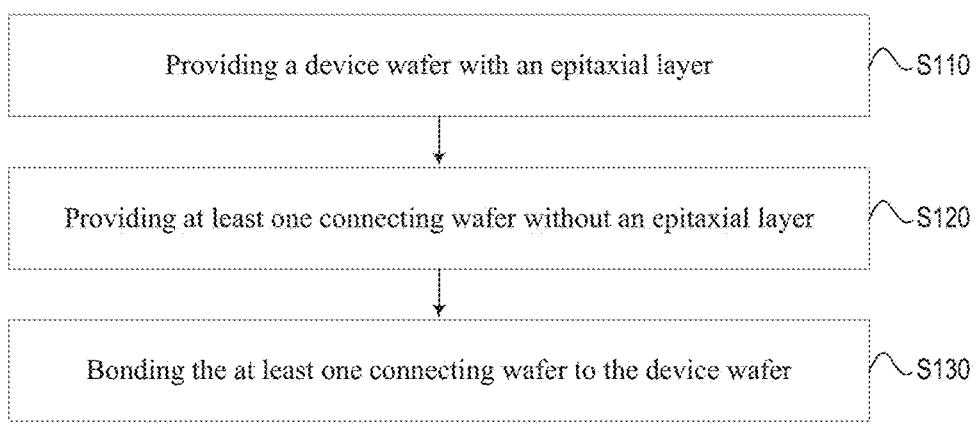
FIG. 1 illustrates a flow diagram of an exemplary method for forming a joint channel hole structure of a 3D memory device in accordance with some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

Various embodiments in accordance with the present disclosure provide fabricating methods for a 3D memory device. In some embodiments, methods forming a dual-deck or multi-deck channel hole structure of the 3D memory device are provided. By performing two or more channel hole formation processes on two or more wafers and then bonding the two or more wafers, a dual-deck or multi-deck channel hole structure having a large aspect ratio and a limited top-bottom aperture error can be formed. By performing hybrid bonding process between wafers, the joined inter-deck channel connection structures can have a robust structure strength and a controlled thickness. As such, the channel mobility and the string current of the 3D memory device can be significantly improved. Further, the disclosed method can dramatically speed up the deep channel hole development, which results in an efficient process capability control, a simplified process complexity, and a reduced cost.

As long as the number of the conductive/dielectric pairs or oxide/nitride pairs goes larger, it becomes difficult to use a single etching process to form the channel holes in the 3D memory devices that have a substantial depth. As the channel hole aspect ratio increases, channel hole etching becomes exponentially slower. Further, the process capability control of the formed channel holes, including bow-free, straight profile, critical dimension (CD) uniformity, minimal twisting, etc., tend to be more challenging. Thus, a single etching method may not be efficient in both cost and process capability.

Accordingly, the present disclosure provides a method for forming the a joint channel hole structure of the 3D memory devices by bonding two or more wafers. As such, the formed 3D memory devices can have more than 64 conductive/dielectric pairs or oxide/nitride pairs, such as 72, 96, 128, 160, etc. The formed joint channel hole structure in the 3D memory devices can have a large aspect ratio and a limited top-bottom aperture error. The fabricating process can be thereby simplified and the product cost can be significantly reduced.

Referring to FIG. 1, a flow diagram of an exemplary method for forming a joint channel hole structure of a 3D memory device is shown in accordance with some embodiments of the present disclosure. The method can include providing a device wafer with an epitaxial layer at operation S110, providing at least one connecting wafer without an epitaxial layer at operation S120, and bonding the at least one connecting wafer to the device wafer at operation S130. In the following, each operation shown in FIG. 1 is described in details in connection with corresponding figures.

Figure 2:
FIG. 2 illustrates a flow diagram of an exemplary method for forming a device wafer in accordance with some embodiments of the present disclosure.

Referring to FIG. 2, a flow diagram of an exemplary method for forming a device wafer is shown in accordance with some embodiments of the present disclosure. FIGS. 3A-3M illustrate cross-sectional views of an exemplary device wafer at certain fabricating stages of the method shown in FIG. 2. It is noted that, the device wafer is also referred to a first wafer in the following description.

As shown in FIG. 2, the method can start at operation S201, in which a first alternating dielectric stack and a first insulating connection layer can be formed on the surface of a first substrate. In some embodiments, the first substrate can be any suitable semiconductor substrate having any suitable structure, such as a monocrystalline single-layer substrate, a polycrystalline silicon (polysilicon) single-layer substrate, a polysilicon and metal multi-layer substrate, etc.

Figure 3A:
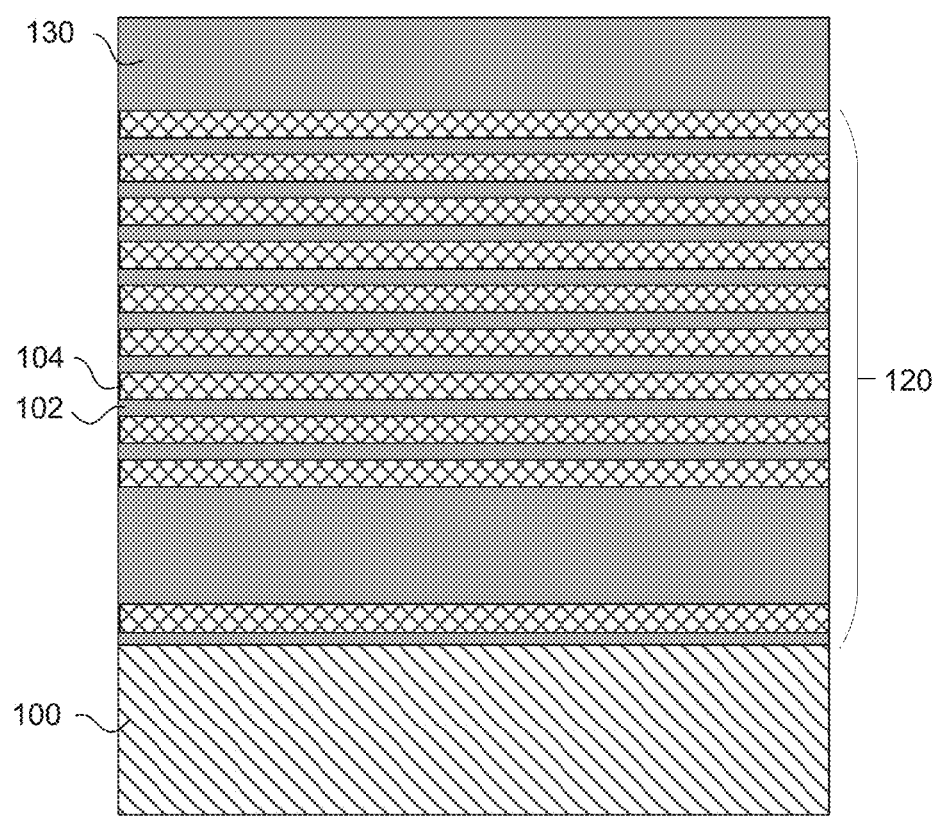
FIGS. 3A-3M illustrate cross-sectional views of an exemplary device wafer at certain fabricating stages of the method shown in FIG. 2 in accordance with some embodiments of the present disclosure.

As shown in FIG. 3A, the first alternating dielectric stack 120 including a plurality of dielectric layer pairs can be formed on the first substrate 100. The first alternating dielectric stack 120 can include an alternating stack of a first dielectric layer 102 (e.g., of silicon oxide) and a second dielectric layer 104 (e.g., of silicon nitride) that is different from first dielectric layer. In some embodiments, the second dielectric layers 104 are to be replaced by conductive layers in the subsequent processes, so they are also referred as sacrificial layers.

The plurality of first dielectric layers 102 and second dielectric layers 104 are extended in a lateral direction that is parallel to a surface of the first substrate 100. In some embodiments, there are more layers than the dielectric layer pairs made of different materials and with different thicknesses in the first alternating dielectric stack 120. The first alternating dielectric stack 120 can be formed by one or more thin film deposition processes including, but not limited to, Chemical Vapor Deposition (CVD), Physical Vapor Deposition (PVD), Atomic Layer Deposition (ALD), or any combination thereof.

In some embodiments, the first alternating dielectric stack 120 can include a plurality of oxide/nitride layer pairs. Each dielectric layer pair includes a layer of silicon oxide 102 and a layer of silicon nitride 104. The plurality of oxide/nitride layer pairs are also referred to herein as an "alternating oxide/nitride stack." That is, in the first alternating dielectric stack 120, multiple oxide layers 102 (shown in the areas with dotes) and multiple nitride layers 104 (shown in the areas with meshes) alternate in a vertical direction. In other words, except a top and a bottom layer of a given alternating oxide/nitride stack, each of the other oxide layers 102 can be sandwiched by two adjacent nitride layers 104, and each of the nitride layers 104 can be sandwiched by two adjacent oxide layers 102.

Oxide layers can each have the same thickness or have different thicknesses. For example, a thickness of each oxide layer can be in a range from 90 nm to 160 nm, preferably about 150 nm. Similarly, nitride layers can each have the same thickness or have different thicknesses. For example, a thickness of each nitride layer can be in a range from 80 nm to 110 nm, preferably about 100 nm.

It is noted that, in the present disclosure, the oxide layers 102 and/or nitride layers 104 can include any suitable oxide materials and/or nitride materials. For example, the element of the oxide materials and/or nitride materials can include, but not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

The first alternating dielectric stack 120 can include any suitable number of layers of the oxide layers 102 and the nitride layers 104. In some embodiments, a total number of layers of the oxide layers 102 and the nitride layers 104 in the first alternating dielectric stack 120 is equal to or larger than 64. That is, a number of oxide/nitride layer pairs can be equal to or larger than 32. In some embodiments, alternating oxide/nitride stack includes more oxide layers or more nitride layers with different materials and/or thicknesses than the oxide/nitride layer pair.

The first insulating connection layer 130 can be formed on the first alternating dielectric stack 120. In some embodiments, the first insulating connection layer 130 can be made by any suitable insulating material and/or dielectric material, such as silicon oxide. It is noted that, the material of the first insulating connection layer 130 can be different from the material of the nitride layer in the first alternating dielectric stack 120. The first insulating connection layer 130 can be formed on the top surface of the alternating dielectric stack 120.

In some embodiments, the first alternating dielectric stack 120 and the first insulating connection layer 130 can be formed by using one or more deposition processes. It is noted that, the term "deposition process" used in the present disclosure can be referred to any suitable deposition process including, but not limited to, a chemical vapor deposition (CVD) process, a physical vapor deposition (PVD) process, an atomic layer deposition (ALD) process, and/or any suitable combination thereof.

Figure 3B:
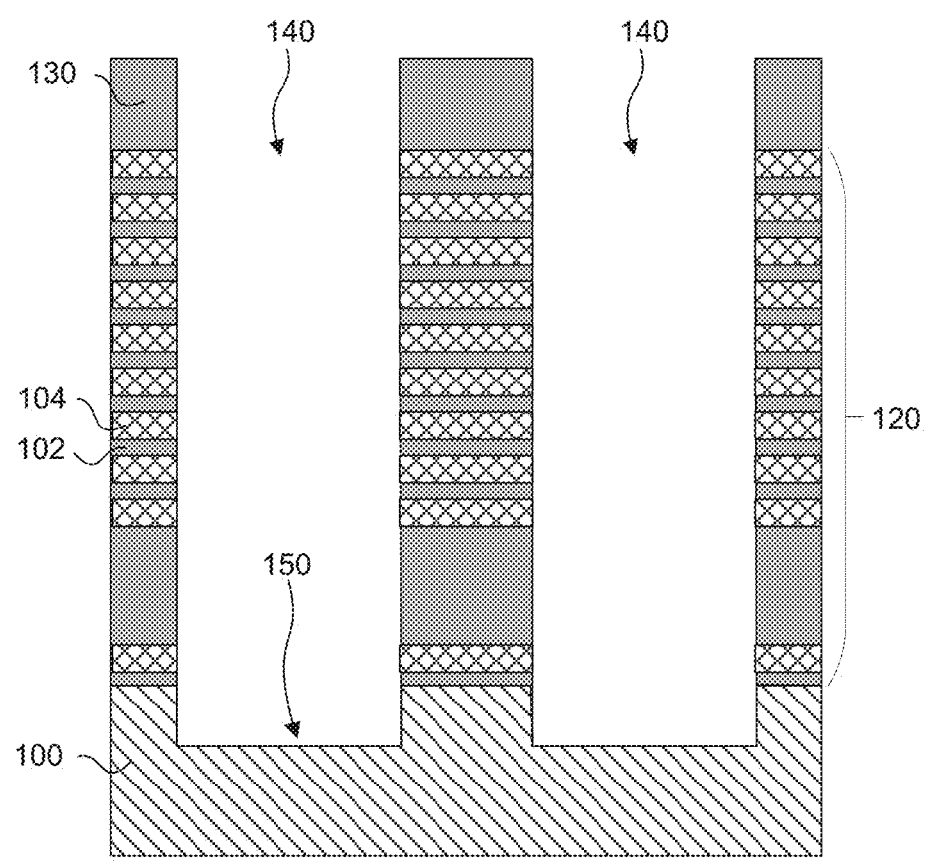

Referring back to FIG. 2, the method can process to operation S202, in which multiple first channel holes 140 can be formed. As shown in FIG. 3B, each first channel hole 140 can completely penetrate the first alternating dielectric stack 120 and the first insulating connection layer 130, and can extend into the surface of the first substrate 100 to form a first recess 150. In some embodiments, the multiple channel hole 140 can be formed by photoresist patterning and etching the first alternating dielectric stack 120 and the first insulating connection layer 130, and a subsequent ashing process and cleaning process. The etching process to form the multiple channel holes 140 can be a wet etching, a dry etching, or a combination thereof. The ashing process can be a plasma ashing, and the cleaning process can be a wet cleaning.

Figure 3C:
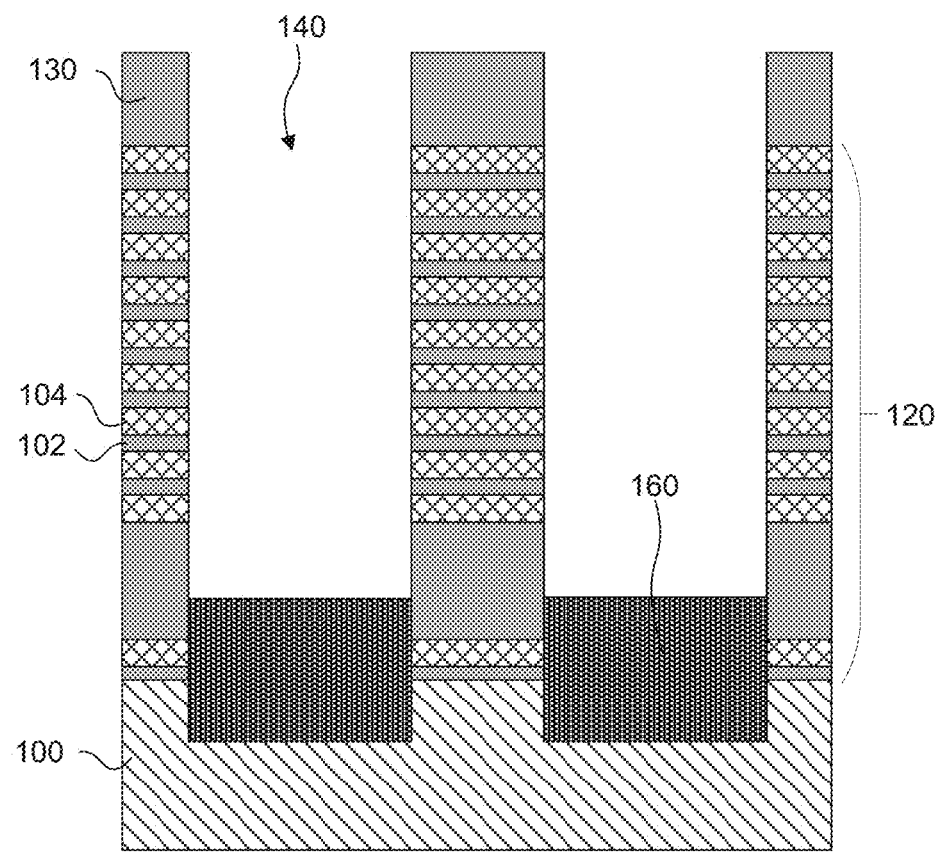

Referring back to FIG. 2, the method can process to operation S203, in which an epitaxial layer 160 can be formed in the first recess 150 in each first channel hole 140, as shown in FIG. 3C. In some embodiments, the epitaxial layer 160 can be a polycrystalline silicon (polysilicon) layer formed by using a selective epitaxial growth (SEG) process. For example, an SEG pre-clean process can be performed to clean the multiple channel holes 140. A following deposition process can be performed to form a polysilicon layer in the first recess 150 in each first channel hole 140. And an ion metal plasma (IMP) process can be performed on the polysilicon layer to form the epitaxial layer 160. In some embodiments, the epitaxial layer 160 may not directly formed on the surface of the first substrate 100. One or more layers can be formed between the epitaxial layer 160 and the first substrate 100. That is, the epitaxial layer 160 is overlay the first substrate 100.

Figure 3D:
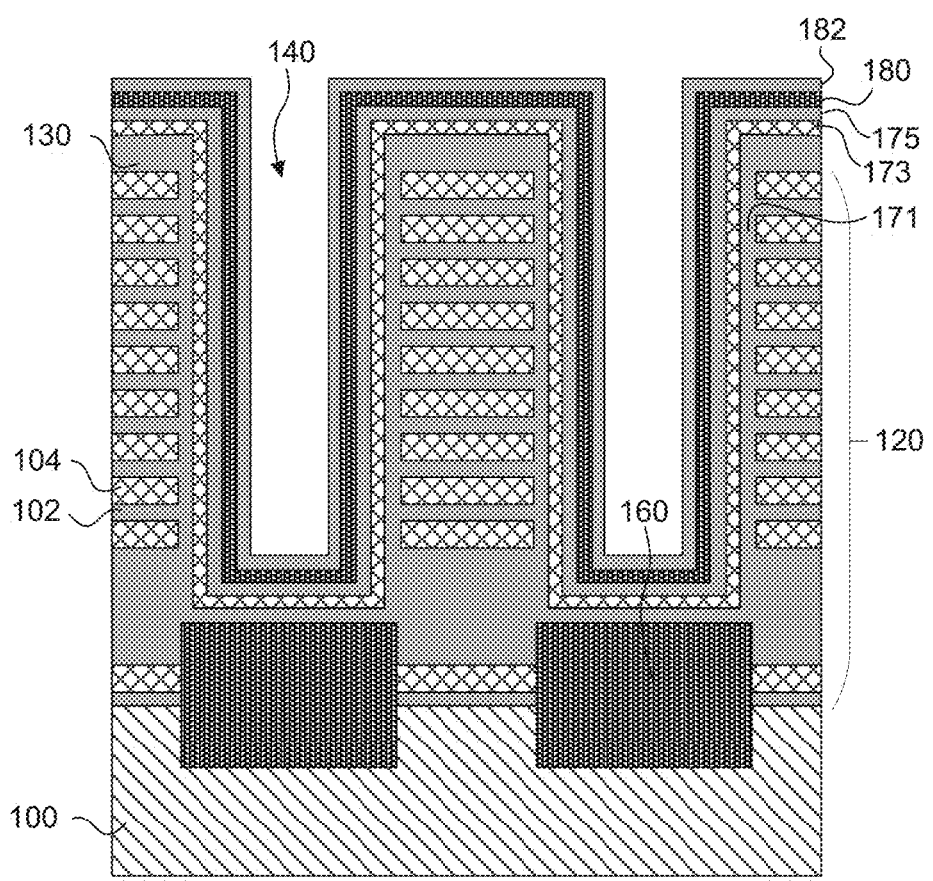

Referring back to FIG. 2, the method can process to operation S204, in which a first functional layer can be formed to cover the sidewall of each first channel hole 140 and the top surface of the epitaxial layer 160 in each first channel hole 140. As shown in FIG. 3D, the first functional layer can include a first barrier layer 171, a first storage layer 173, and a first tunneling layer 175. The first functional layer can also cover the top surface of the first insulating connection layer 130. In some embodiments, the first functional layer can also be referred to a charge trapping layer.

The first barrier layer 171 can be formed on the sidewall of each first channel hole 140 and the top surface of the epitaxial layer 6 in each first channel hole 140. The first barrier layer 171 can be used for blocking the outflow of the electronic charges. In some embodiments, the first barrier layer 171 can be a silicon oxide layer or a combination of silicon oxide/silicon nitride/silicon oxide (ONO) layers. In some embodiments, the first barrier layer 171 includes high dielectric constant (high-k) dielectrics (e.g., aluminum oxide). In one example, the first barrier layer 171 is an oxide layer formed by using a deposition process. In some embodiments, a thickness of the first barrier layer 171 can be in a range from about 3 nm to 20 nm.

The first storage layer 173 can be formed on the surface of the first barrier layer 171. The first storage layer 173 can be used for storing electronic charges. The storage or removal of charge in the first storage layer 173 can impact the on/off state and/or a conductance of the semiconductor channel. The first storage layer 173 can include polycrystalline silicon (polysilicon) or silicon nitride. The first storage layer 173 can include one or more films of materials including, but are not limited to, silicon nitride, silicon oxynitride, a combination of silicon oxide and silicon nitride, or any combination thereof. In some embodiments, the first storage layer 173 can include a nitride layer formed by using one or more deposition processes. In some embodiments, a thickness of the first storage layer 173 can be in a range from about 3 nm to 20 nm.

The first tunneling layer 175 can be formed on the surface of the first storage layer 174. The first tunneling layer 175 can be used for generating electronic charges (electrons or holes). The first tunneling layer 175 can include dielectric materials including, but not limited to, silicon oxide, silicon nitride, silicon oxynitride, or any combination thereof. In some embodiments, the first tunneling layer 175 can be an oxide layer formed by using a deposition process. In some embodiments, a thickness of the first tunneling layer 175 can be in a range from about 3 nm to 20 nm.

Referring back to FIG. 2, the method can process to operation S205, in which a first channel layer 180 can be formed to cover the first functional layer, and a first protecting layer 182 can be formed to cover the first channel layer 180. As shown in FIG. 3D, the first channel layer 180 can be formed to cover the first tunneling layer 175. In some embodiments, the first channel layer 180 can be an amorphous silicon layer or a polysilicon layer formed by using a thin film deposition process, such as ALD, CVD, PVD, or any other suitable process. In some embodiments, a thickness of the first channel layer 180 can be in a range from about 5 nm to 20 nm.

In some embodiments, a first protecting layer 182 can be formed to cover the first channel layer 180 to protect the first channel layer 180 from being damaged in a subsequent removal process. In some embodiments, the first protecting layer 182 can be an oxide layer formed by using a thin film deposition process, such as ALD, CVD, PVD, or any other suitable process. In some embodiments, a thickness of the first protecting layer 182 can be in a range from about 5 nm to 20 nm.

Figure 3E:
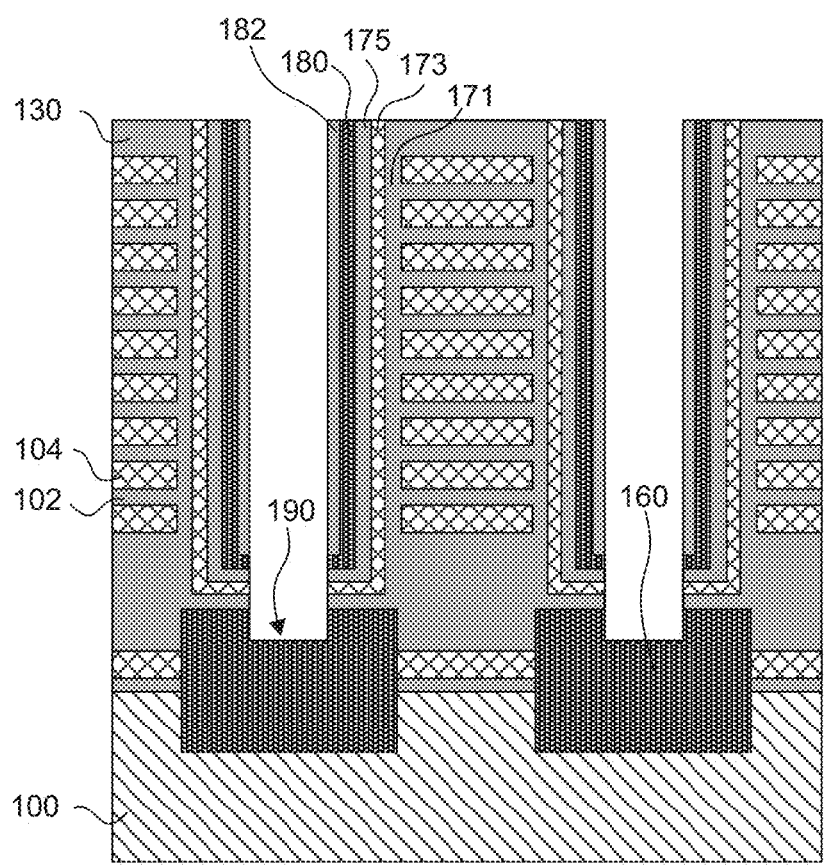

Referring back to FIG. 2, the method can process to operation S206, in which portions of the first functional layer, the first channel layer 180, and the first protecting layer 182 on the bottom of each first channel hole 140 can be removed to form a second recess 190 that exposes or extends into the epitaxial layer 160. In some embodiments, as shown in FIG. 3E, the portions of the first functional layer, the first channel layer 180, and the first protecting layer 182 located on the top surface of the epitaxial layer 160 at the bottom of each first channel hole 140 can be etched along the vertical surface of the first protecting layer 182. As such, the formed second recess 190 can expose or extend into the epitaxial layer 160 in each first channel hole 140.

In some embodiment, in the same etching process, portions of the first functional layer, the first channel layer 180, the first protecting layer 182, and a portion of the first insulating connection layer 130 can also be removed. A following chemical mechanical polishing (CMP) process can be performed to planarize the top surface of the first insulating connection layer 130, as shown in FIG. 3E. In some embodiments, in the same etching process, the first protecting layer 182 can also be removed.

Figure 3F:
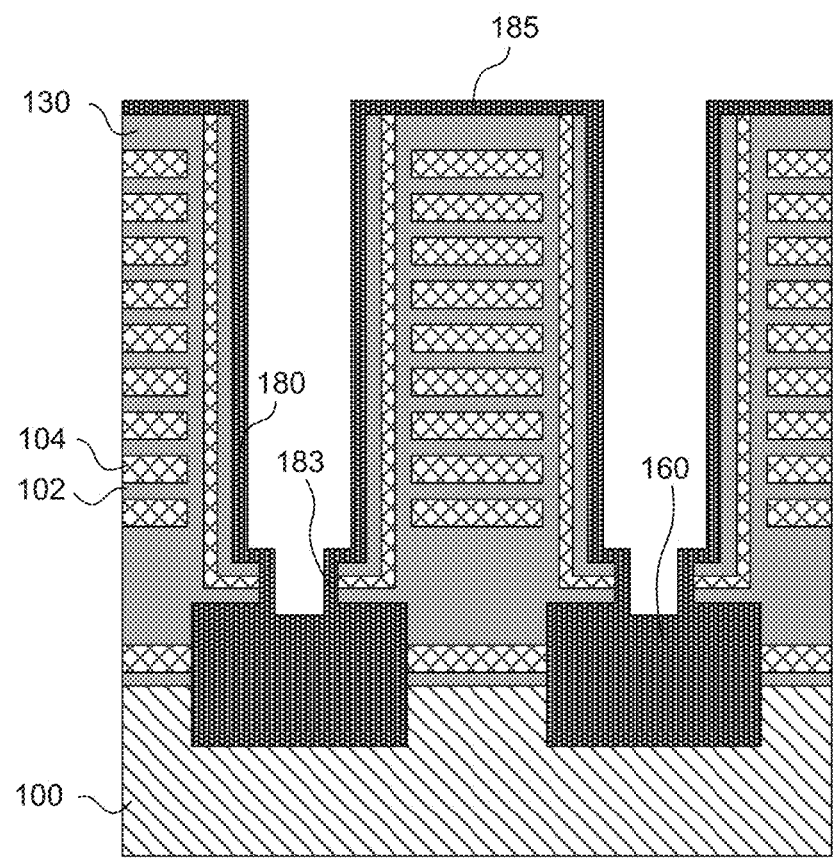

Referring back to FIG. 2, the method can process to operation S207, in which a first lower channel connection layer 183 and a first upper channel connection layer 185 can be formed. As shown in FIG. 3F, the first lower channel connection layer 183 can be formed on the sidewalls of each second recess 190 in a vertical direction. As such, the first channel layer 180 and the epitaxial layer 160 can be connected by the first lower channel connection layer 183. Further, the first upper channel connection layer 185 can also be formed on the top surface of the first insulating connection layer 130 in a lateral direction. In some embodiments, the first lower channel connection layer 183 and the first upper channel connection layer 185 can be amorphous silicon layers or polysilicon layers formed simultaneously by using a thin film deposition process, such as ALD, CVD, PVD, or any other suitable process.

Figure 3G:
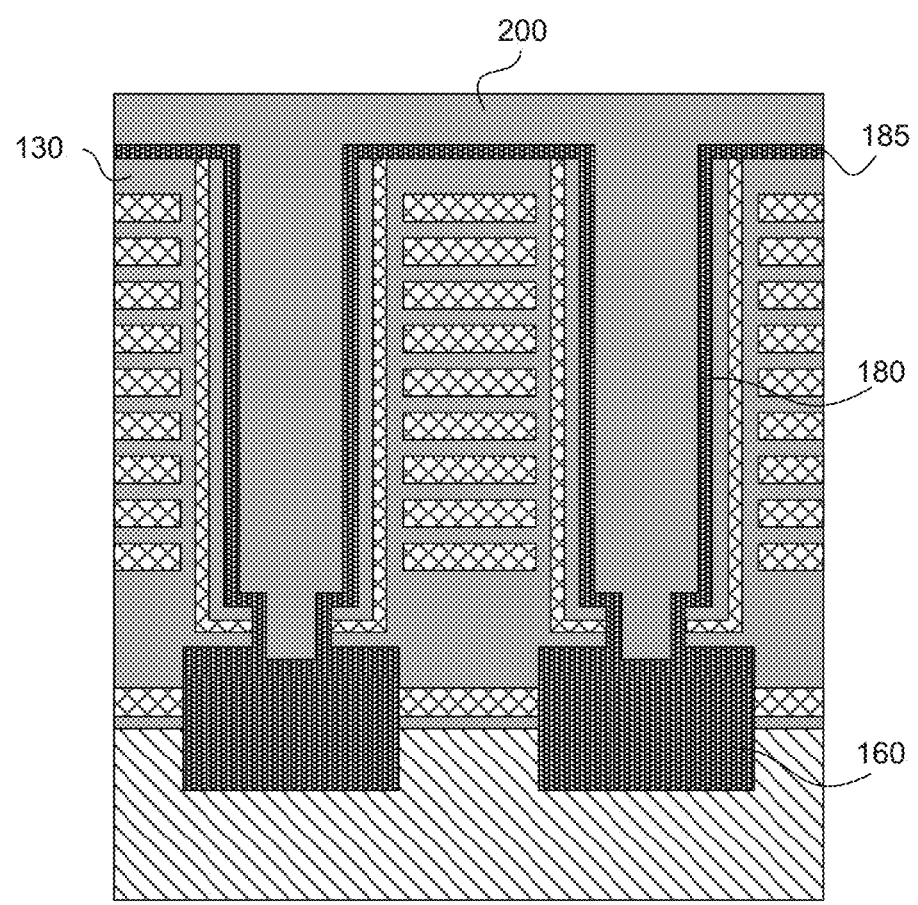

Referring back to FIG. 2, the method can process to operation S208, in which a first filling structure 200 can be formed to fill each first channel hole 140. As shown in FIG. 3G, a first filling structure 200 can be formed to cover the first upper channel connection layer 185 and fill each first channel hole 140. In some embodiments, the first filling structure 200 can be an oxide layer, such as a silicon oxide layer. In some embodiments, the first filling structure 200 can include one or more airgaps (not shown in figures).

Figure 3H:
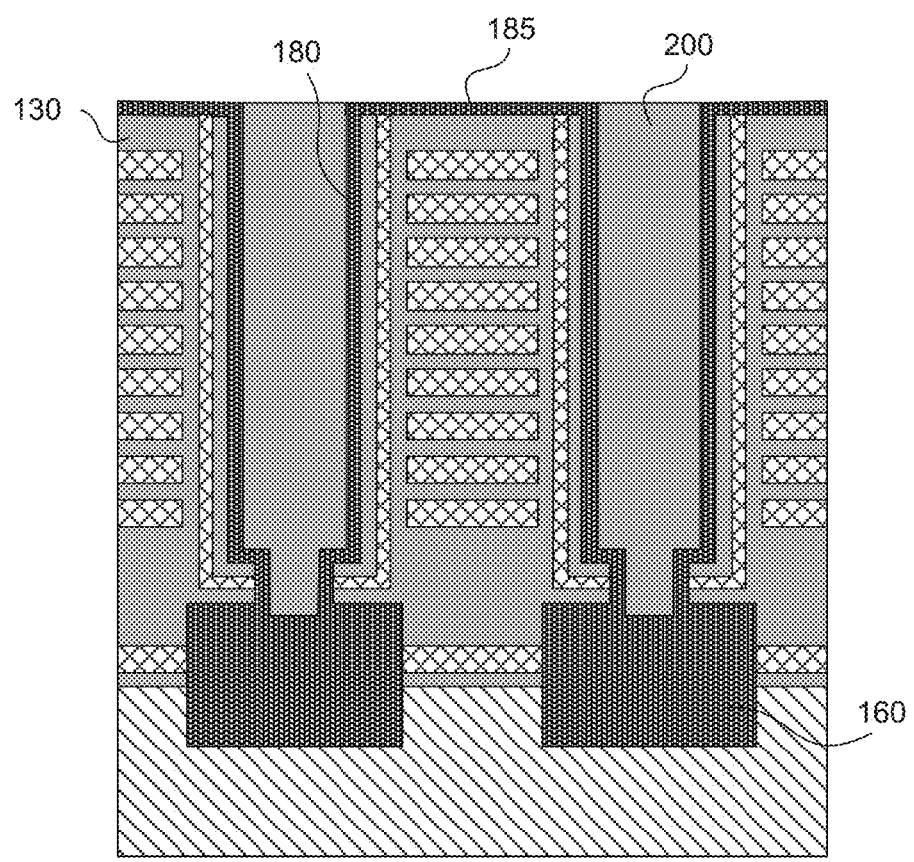

In some embodiments, the first filling structure 200 can be formed by a first deposition filling process, an etching back process, and a second deposition filling process. A portion of the first channel plug 16 outside the multiple first channel holes 140 can be removed by a chemical mechanical polishing (CMP) process. As such, the first upper channel connection layer 185 above the first insulating layer 130 can be exposed, as shown in FIG. 3H.

Referring back to FIG. 2, the method can process to operation S209, in which portions of the first upper channel connection layer 185 can be removed to expose the first insulating connection layer 130 and the first storage layer 173 of the first functional layer in each first channel hole 140. Specifically, the portions of the first upper channel connection layer 185 can be removed by using a lithography process. The remaining portions of the first upper channel connection layer 185 can form multiple first upper channel connection structures 187.

Figure 3I:
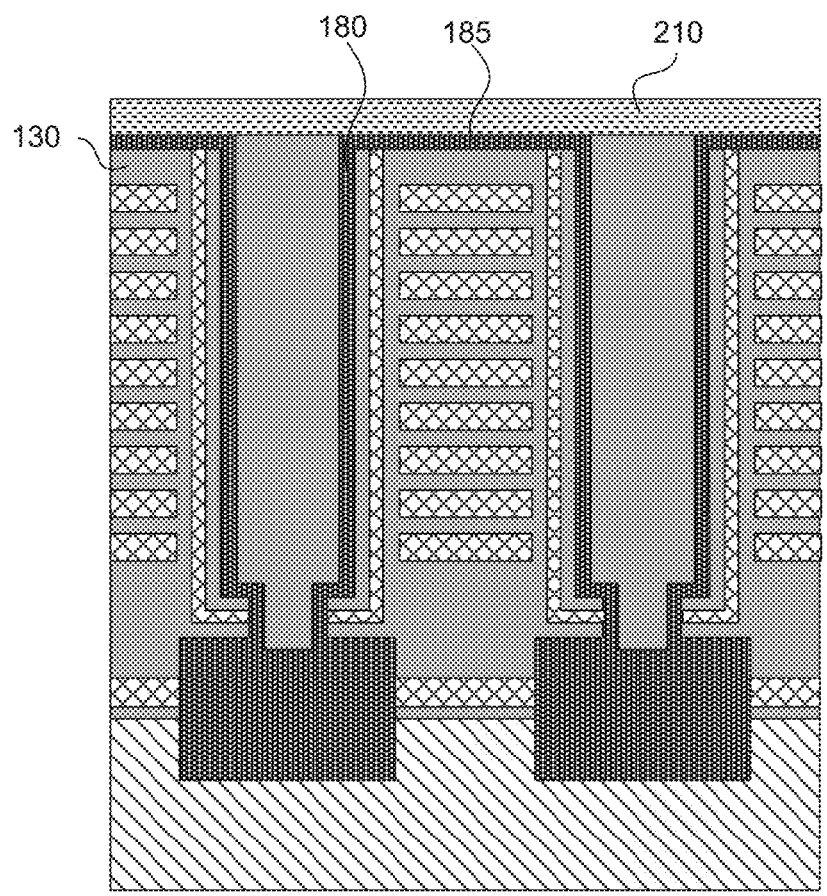

Specifically, a first photoresist layer 210 can be coated over the first upper channel connection layer 185 and the multiple first filling structures 200, as shown in FIG. 3I. A patterning process can be performed to expose portions of the first upper channel connection layer 185 that correspond to the first insulating connection layer 130 as well as the first barrier layer 171 and the first storage layer 173 of the first functional layer in each first channel hole 140. Using the patterned first photoresist layer 210 as a mask, the exposed portions of the first upper channel connection layer 185 can be removed by any suitable etching process. A following ashing process and a wet cleaning process can be performed.

Figure 3J:
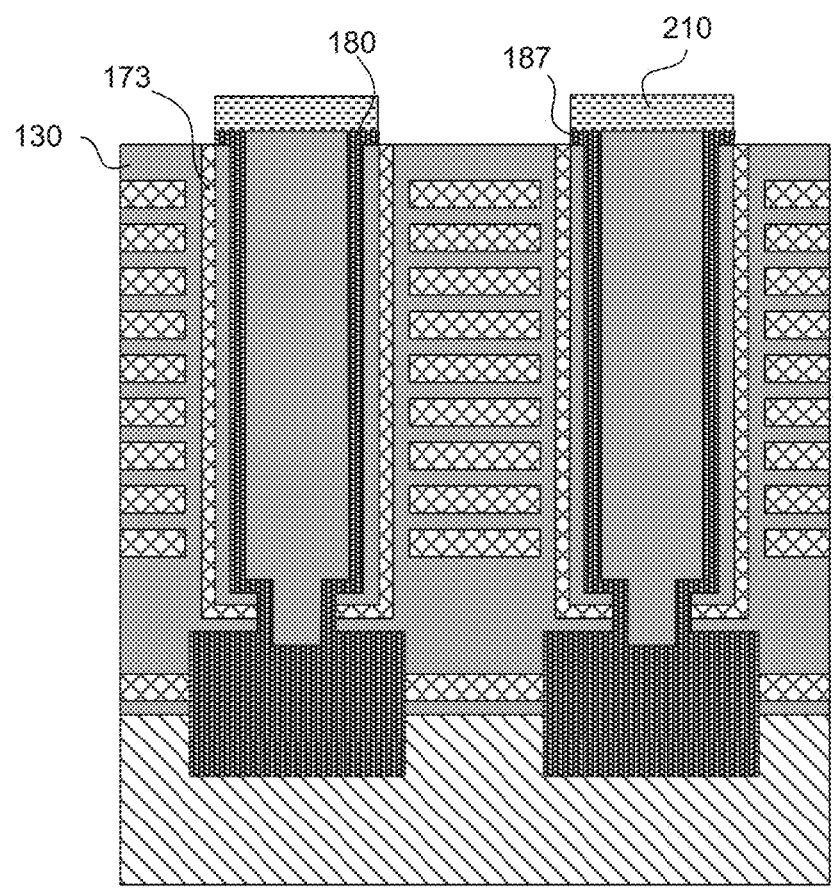

As such, as shown in FIG. 3J, the first insulating connection layer 130 and the first storage layers 173 can be exposed. The remaining portions of the first upper channel connection layer 185 can form multiple first upper channel connection structures 187. Each of the multiple first upper channel connection structures 187 can have a ring shape. A width of the ring can equal to a summation of the thickness of the first tunneling layer 175 of the first functional layer and the thickness of the first channel layer 180.

Figure 3K:
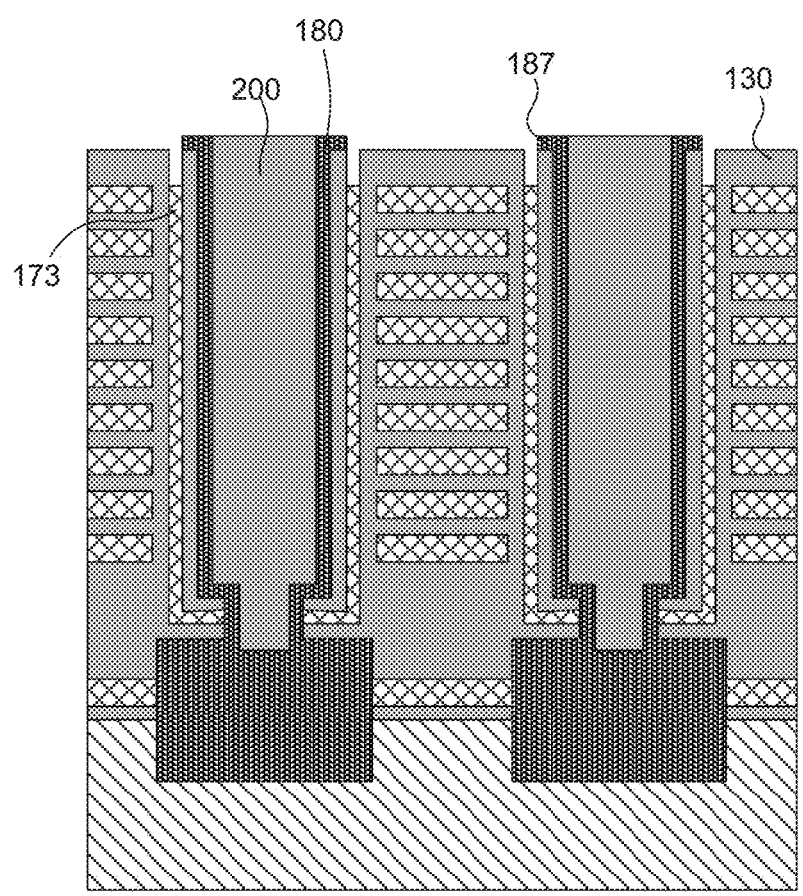

Referring back to FIG. 2, the method can process to operation S210, in which an upper portion of the first storage layer 173 of the first functional layer in each first channel hole 140 can be removed. As shown in FIG. 3K, a wet etching process can be performed to remove the upper portion of the first storage layers 173 of the first functional layer in each first channel hole 140. As such, a distance between the top surface of the first storage layers 173 and the sidewall surface of the first upper channel connection structures 187 can be increased to avoid potential short problem.

Referring back to FIG. 2, the method can process to operation S211, in which the first insulation connection layer 130 and the first filling structures 200 can be refilled, such that the top surfaces of the first insulation connection layer 130 and the first filling structures 200 can be in level with the top surfaces of the first upper channel connection structures 187.

Figure 3L:
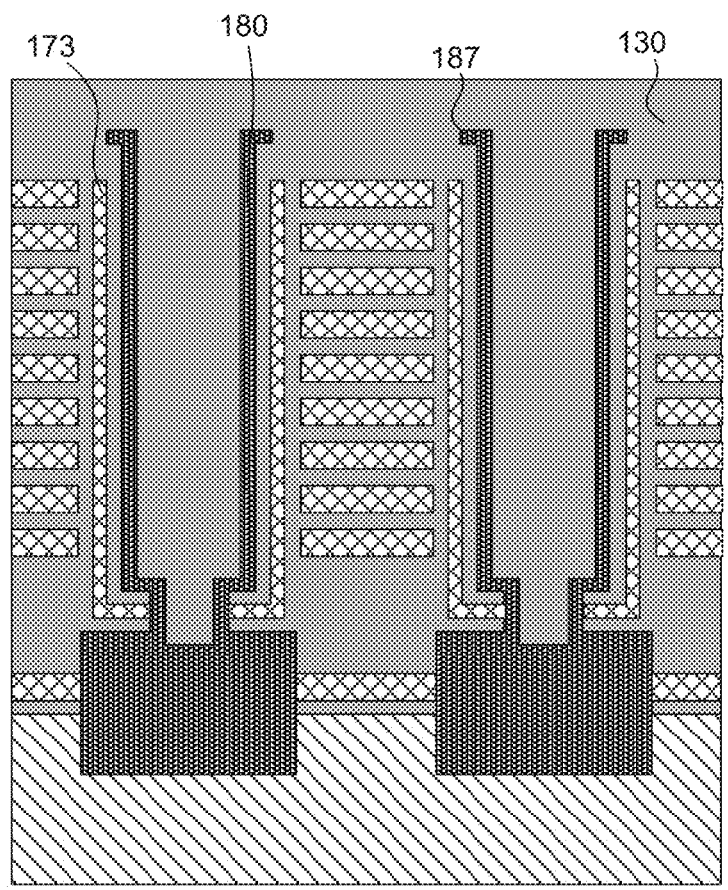
Figure 3M:
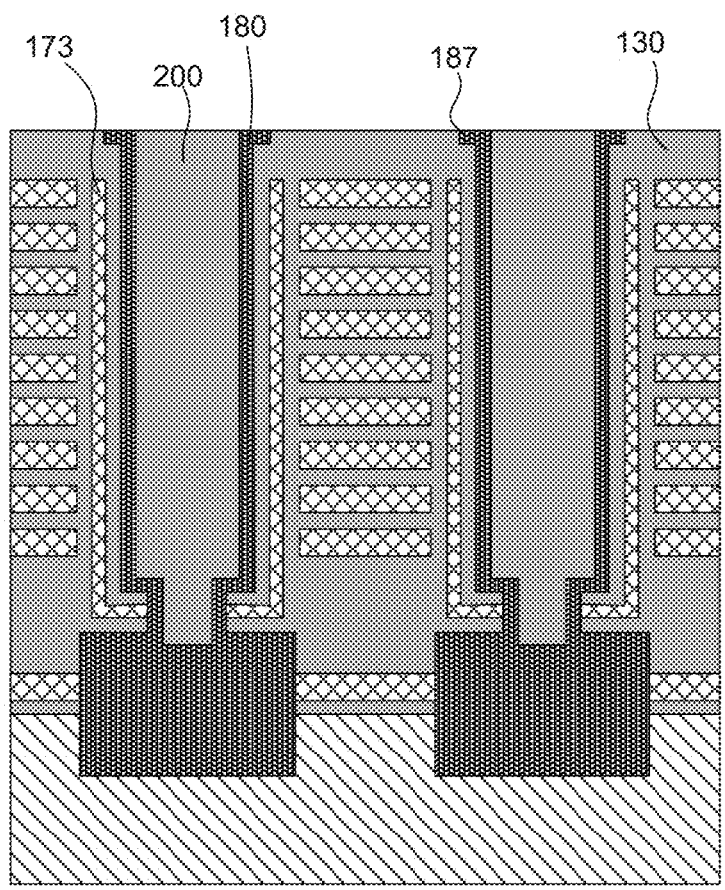

Specifically, a deposition process can be performed to deposit the same material of the first insulation connection layer 130. As such, the gaps formed by removing the upper portions of the of the first storage layers 173 can be filled up, and a top surface of the newly formed first insulation connection layer 130 can be higher than the first upper channel connection structures 187, as shown in FIG. 3L. A following chemical mechanical polishing (CMP) process can be performed to remove the upper portion of the first insulation connection layer 130. As such, the top surfaces of the first insulation connection layer 130 and the first filling structures 200 can be planarized and in level with the top surfaces of the first upper channel connection structures 187, as shown in FIG. 3M.

Figure 4:
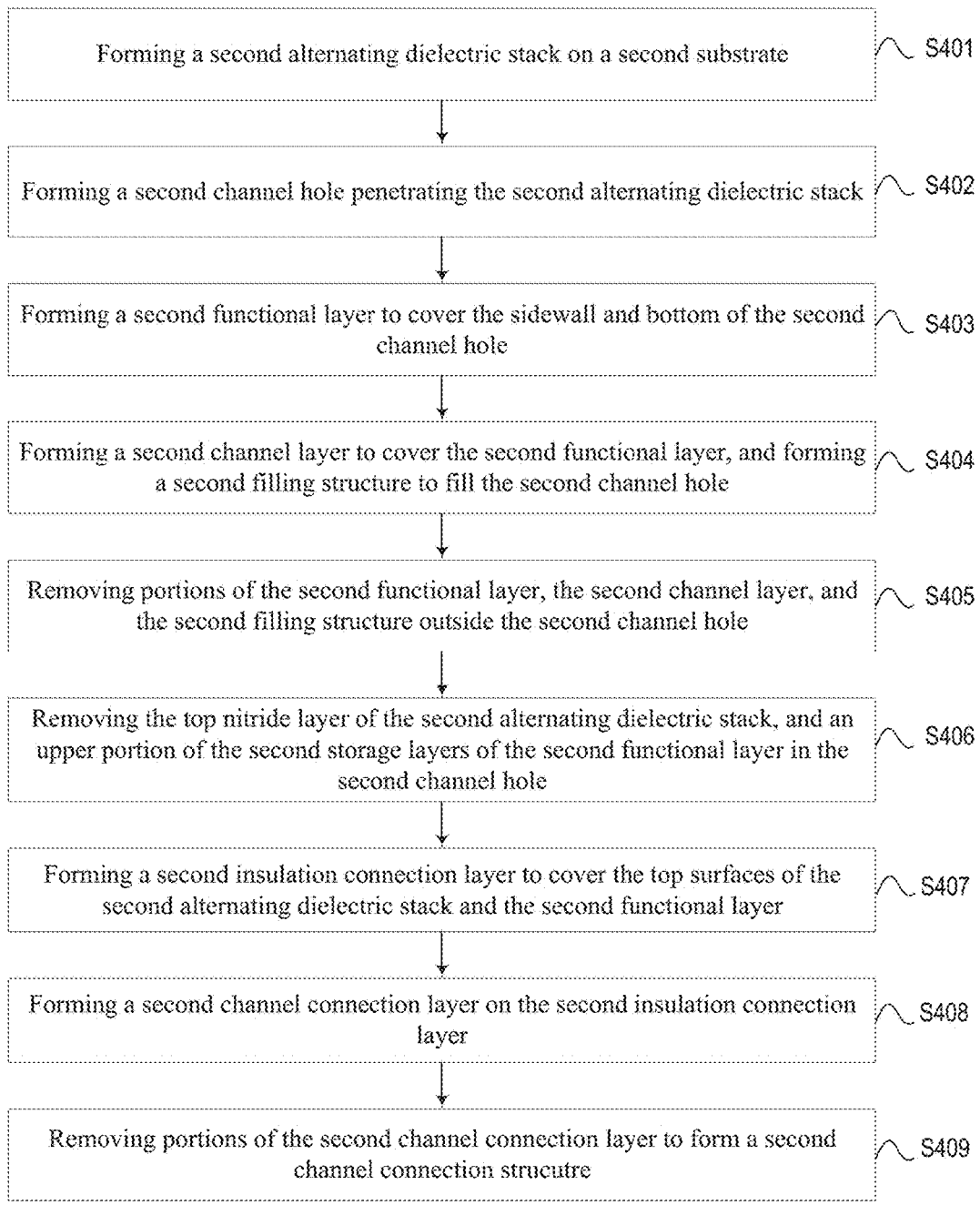
FIG. 4 illustrates a flow diagram of an exemplary method for forming a connecting wafer in accordance with some embodiments of the present disclosure.

Referring to FIG. 4, a flow diagram of an exemplary method for forming a connecting wafer is shown in accordance with some embodiments of the present disclosure. FIGS. 5A-5L illustrate cross-sectional views of an exemplary connecting wafer at certain fabricating stages of the method shown in FIG. 4. It is noted that, the connecting wafer is also referred to a common bonding wafer, or a second wafer in the following description.

As shown in FIG. 4, the method can start at operation S401, in which a second alternating dielectric stack can be formed on the surface of a second substrate. In some embodiments, the second substrate can be any suitable semiconductor substrate having any suitable structure, such as a monocrystalline single-layer substrate, a polycrystalline silicon (polysilicon) single-layer substrate, a polysilicon and metal multi-layer substrate, etc.

As shown in FIG. 3A, the second alternating dielectric stack 320 including a plurality of dielectric layer pairs can be formed on the second substrate 300. The second alternating dielectric stack 320 can include an alternating stack of a first dielectric layer 302 (e.g., of silicon oxide) and a second dielectric layer 304 (e.g., of silicon nitride) that is different from first dielectric layer. In some embodiments, the second dielectric layers 304 are to be replaced by conductive layers in the subsequent processes, so they are also referred as sacrificial layers.

The plurality of first dielectric layers 302 and second dielectric layers 304 are extended in a lateral direction that is parallel to a surface of the second substrate 300. In some embodiments, there are more layers than the dielectric layer pairs made of different materials and with different thicknesses in the second alternating dielectric stack 320. The second alternating dielectric stack 320 can be formed by one or more thin film deposition processes including, but not limited to, Chemical Vapor Deposition (CVD), Physical Vapor Deposition (PVD), Atomic Layer Deposition (ALD), or any combination thereof.

In some embodiments, the second alternating dielectric stack 320 can include a plurality of oxide/nitride layer pairs. Each dielectric layer pair includes a layer of silicon oxide 302 and a layer of silicon nitride 304. The plurality of oxide/nitride layer pairs are also referred to herein as an "alternating oxide/nitride stack." That is, in the first alternating dielectric stack 320, multiple oxide layers 302 (shown in the areas with dotes) and multiple nitride layers 304 (shown in the areas with meshes) alternate in a vertical direction. In other words, except a top and a bottom layer of a given alternating oxide/nitride stack, each of the other oxide layers 302 can be sandwiched by two adjacent nitride layers 304, and each of the nitride layers 304 can be sandwiched by two adjacent oxide layers 302.

Oxide layers can each have the same thickness or have different thicknesses. For example, a thickness of each oxide layer can be in a range from 90 nm to 160 nm, preferably about 150 nm. Similarly, nitride layers can each have the same thickness or have different thicknesses. For example, a thickness of each nitride layer can be in a range from 80 nm to 110 nm, preferably about 100 nm.

It is noted that, in the present disclosure, the oxide layers 302 and/or nitride layers 304 can include any suitable oxide materials and/or nitride materials. For example, the element of the oxide materials and/or nitride materials can include, but not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

The second alternating dielectric stack 320 can include any suitable number of layers of the oxide layers 302 and the nitride layers 304. In some embodiments, a total number of layers of the oxide layers 302 and the nitride layers 304 in the second alternating dielectric stack 320 is equal to or larger than 64. That is, a number of oxide/nitride layer pairs can be equal to or larger than 32. In some embodiments, alternating oxide/nitride stack includes more oxide layers or more nitride layers with different materials and/or thicknesses than the oxide/nitride layer pair. It is noted that, a top layer of the second alternating oxide/nitride stack is an oxide layer 302.

In some embodiments, the second alternating dielectric stack 320 can be formed by using any suitable deposition processes including, but not limited to, a chemical vapor deposition (CVD) process, a physical vapor deposition (PVD) process, an atomic layer deposition (ALD) process, and/or any suitable combination thereof.

Figure 5A:
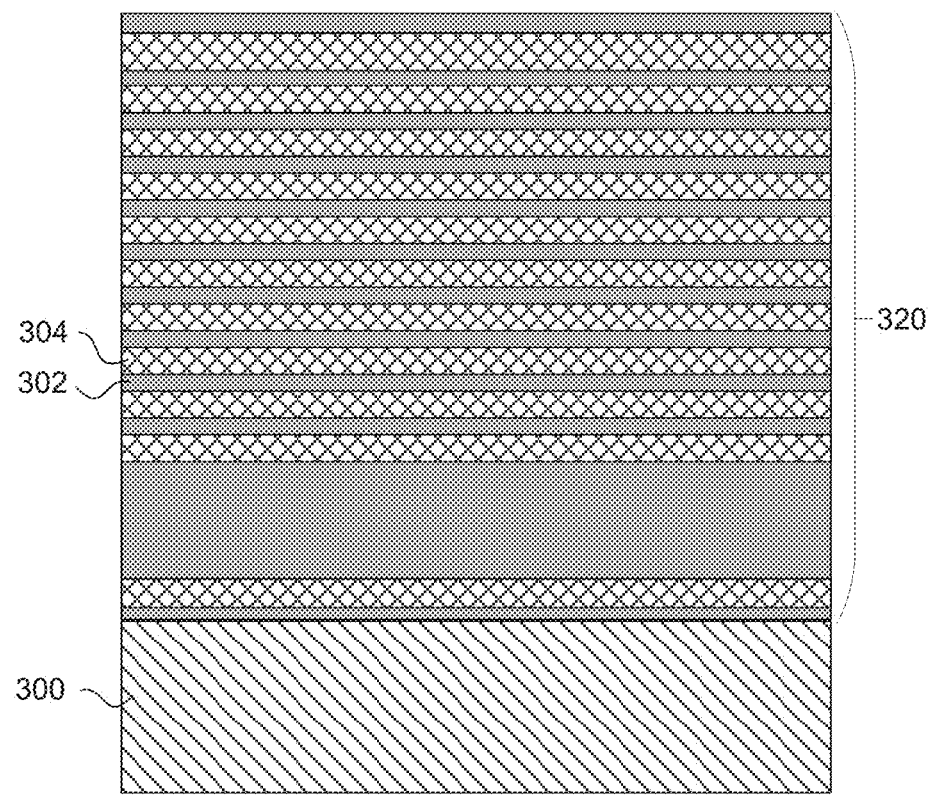
FIGS. 5A-5L illustrate cross-sectional views of an exemplary connecting wafer at certain fabricating stages of the method shown in FIG. 4 in accordance with some embodiments of the present disclosure.
Figure 5B:
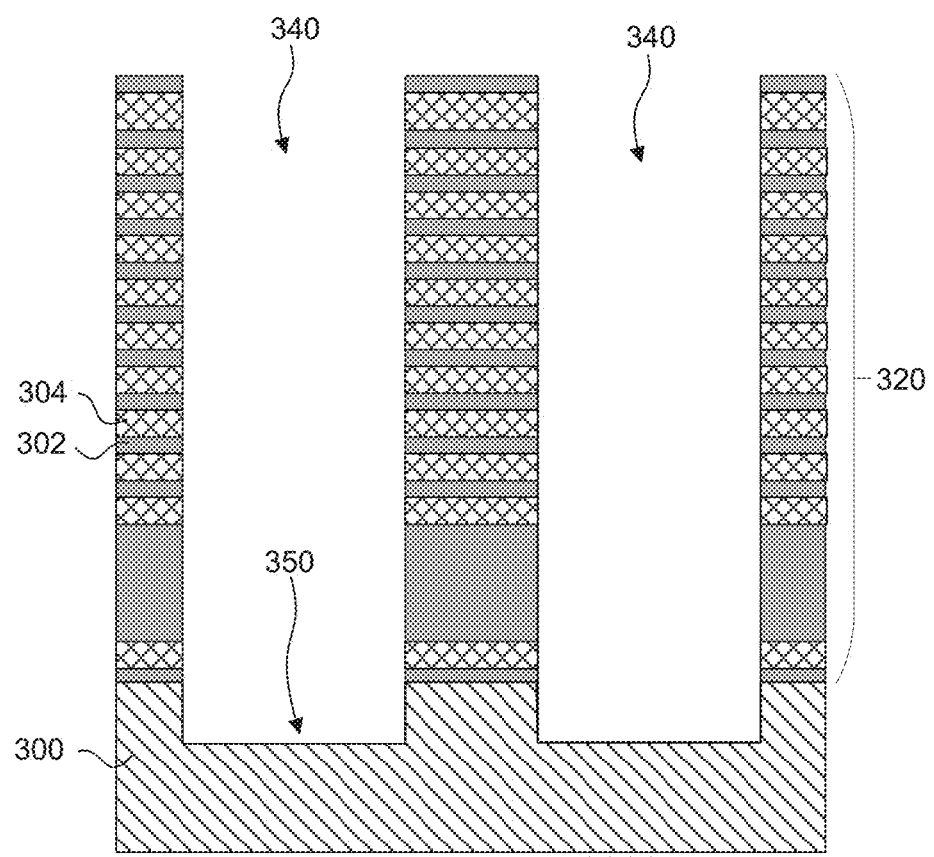

Referring back to FIG. 4, the method can process to operation S402, in which multiple second channel holes 340 can be formed. As shown in FIG. 5B, each first channel hole 340 can completely penetrate the second alternating dielectric stack 320, and can extend into the surface of the second substrate 300 to form a third recess 350. In some embodiments, the multiple channel hole 340 can be formed by photoresist patterning and etching the second alternating dielectric stack 320, and a subsequent ashing process and cleaning process. The etching process to form the multiple channel holes 340 can be a wet etching, a dry etching, or a combination thereof. The ashing process can be a plasma ashing, and the cleaning process can be a wet cleaning.

Figure 5C:
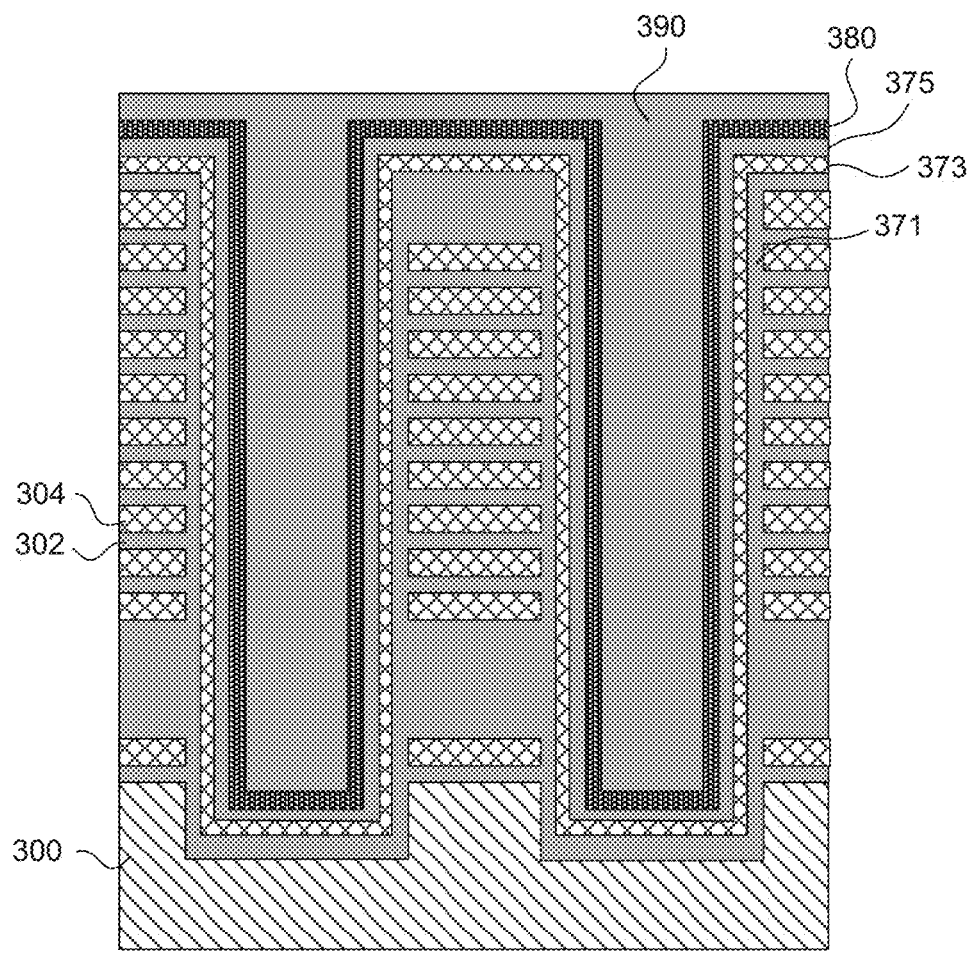

Referring back to FIG. 4, the method can process to operation S403, in which a second functional layer can be formed to cover the sidewall and bottom of each second channel hole 340. As shown in FIG. 5C, the second functional layer can include a second barrier layer 371, a second storage layer 373, and a second tunneling layer 375. The second functional layer can also cover the top surface of the second alternating dielectric stack 320. In some embodiments, the second functional layer can also be referred to a charge trapping layer.

The second barrier layer 371 can be formed on the sidewall and bottom of each second channel hole 340. The second barrier layer 371 can be used for blocking the outflow of the electronic charges. In some embodiments, the second barrier layer 371 can be a silicon oxide layer or a combination of silicon oxide/silicon nitride/silicon oxide (ONO) layers. In some embodiments, the second barrier layer 371 includes high dielectric constant (high-k) dielectrics (e.g., aluminum oxide). In one example, the second barrier layer 371 is an oxide layer formed by using a deposition process. In some embodiments, a thickness of the second barrier layer 371 can be in a range from about 3 nm to 20 nm.

The second storage layer 373 can be formed on the surface of the second barrier layer 371. The second storage layer 373 can be used for storing electronic charges. The storage or removal of charge in the second storage layer 373 can impact the on/off state and/or a conductance of the semiconductor channel. The second storage layer 373 can include polycrystalline silicon (polysilicon) or silicon nitride. The second storage layer 373 can include one or more films of materials including, but are not limited to, silicon nitride, silicon oxynitride, a combination of silicon oxide and silicon nitride, or any combination thereof. In some embodiments, the second storage layer 373 can include a nitride layer formed by using one or more deposition processes. In some embodiments, a thickness of the second storage layer 373 can be in a range from about 3 nm to 20 nm.

The second tunneling layer 375 can be formed on the surface of the second storage layer 374. The second tunneling layer 375 can be used for generating electronic charges (electrons or holes). The second tunneling layer 375 can include dielectric materials including, but not limited to, silicon oxide, silicon nitride, silicon oxynitride, or any combination thereof. In some embodiments, the second tunneling layer 375 can be an oxide layer formed by using a deposition process. In some embodiments, a thickness of the second tunneling layer 375 can be in a range from about 3 nm to 20 nm.

Referring back to FIG. 4, the method can process to operation S404, in which a second channel layer 380 can be formed to cover the second functional layer, and a second filling structure 390 can be formed to fill each second channel hole 340. As shown in FIG. 5C, the second channel layer 380 can be formed to cover the second tunneling layer 375. In some embodiments, the second channel layer 380 can be an amorphous silicon layer or a polysilicon layer formed by using a thin film deposition process, such as ALD, CVD, PVD, or any other suitable process. In some embodiments, a thickness of the second channel layer 380 can be in a range from about 5 nm to 20 nm.

As shown in FIG. 5C, the second filling structure 390 can be formed to cover the surface of the second channel layer 380 and fill each second channel hole 340. In some embodiments, the second filling structure 390 can be an oxide layer, such as a silicon oxide layer. In some embodiments, the second filling structure 390 can include one or more airgaps (not shown in figures). In some embodiments, the second filling structure 390 can be formed by a first deposition filling process, an etching back process, and a second deposition filling process.

Figure 5D:
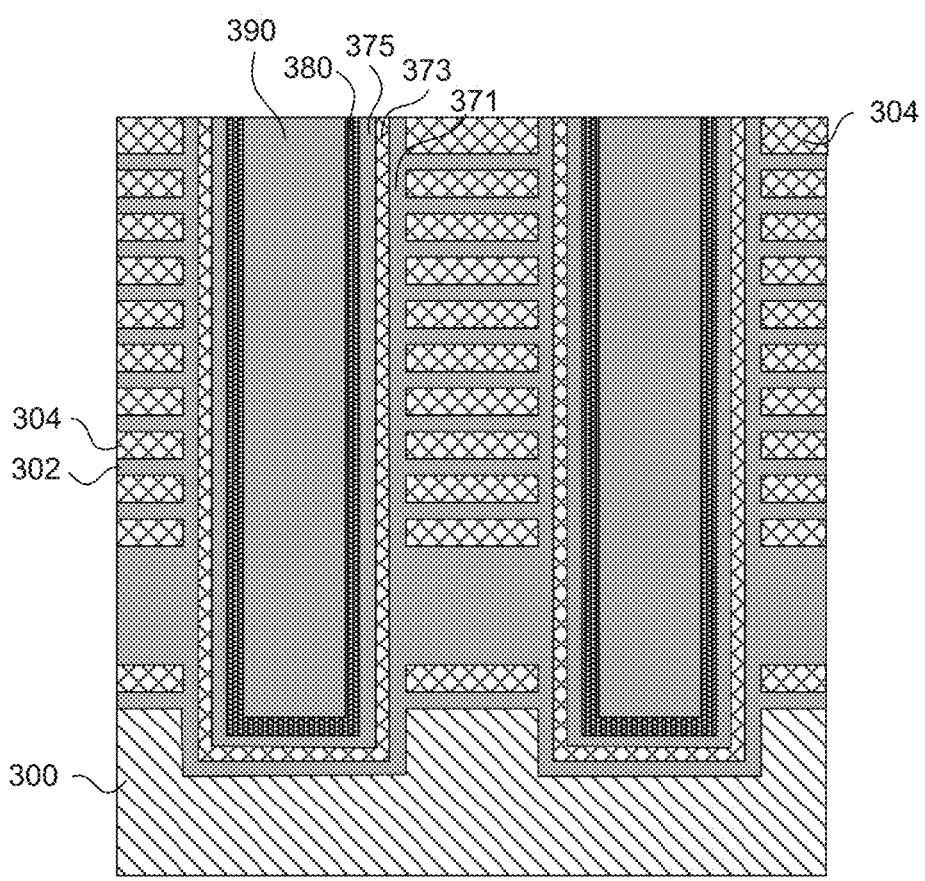

Referring back to FIG. 4, the method can process to operation S405, in which portions of the second functional layer, the second channel layer, and the second filling structure outside the multiple second channel holes 340 can be removed. In some embodiments, a chemical mechanical polishing (CMP) process can be performed to remove the portions of the second functional layer, the second channel layer 380, and the second filling structure 390 that are outside the multiple second channel holes 340. In some embodiments, the top oxide layer 302 of the second alternating dielectric stack 320 can be removed, such that the top nitride layer 304 of the second alternating dielectric stack 320 can be exposed, as shown in FIG. 5D. The top surfaces of the second functional layer, the second channel layer 380, and the second filling structures 390 can be planarized in a same level as the top surface of the top nitride layer 304 of the second alternating dielectric stack 320.

Figure 5E:
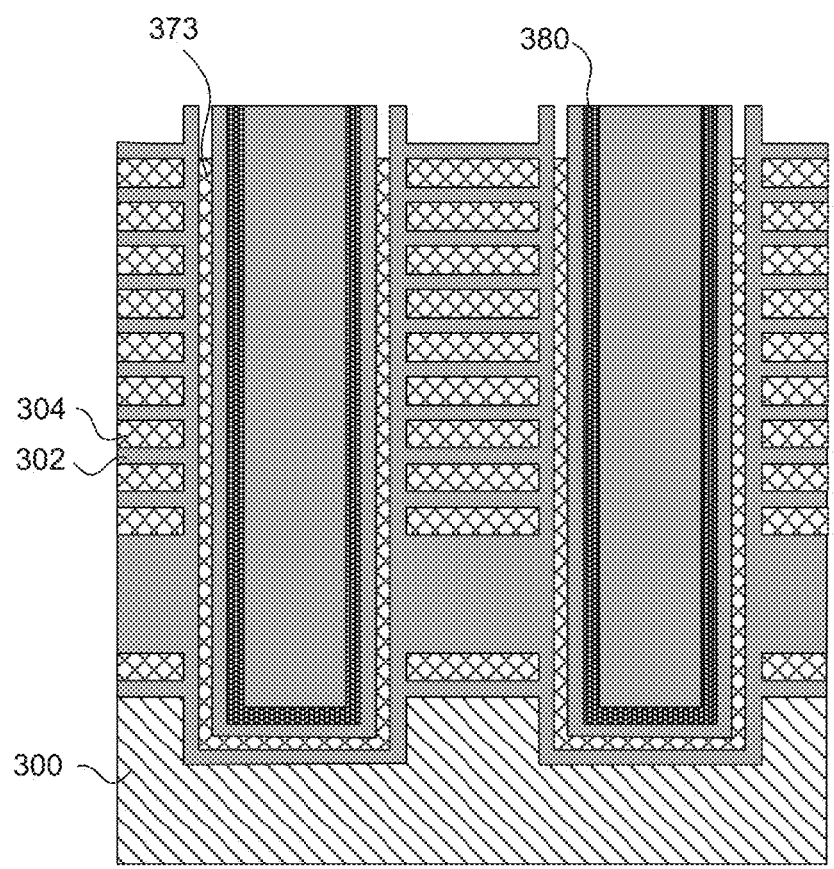

Referring back to FIG. 4, the method can process to operation S406, in which the top nitride layer 304 of the second alternating dielectric stack 320, and an upper portion of the second storage layers 373 of the second functional layer in each second channel hole 340 can be removed. As shown in FIG. 5E, a wet etching process can be performed to remove the top nitride layer 304 of the second alternating dielectric stack 320, as well as the upper portion of the second storage layers 373 of the second functional layer in each second channel hole 340.

Figure 5F:
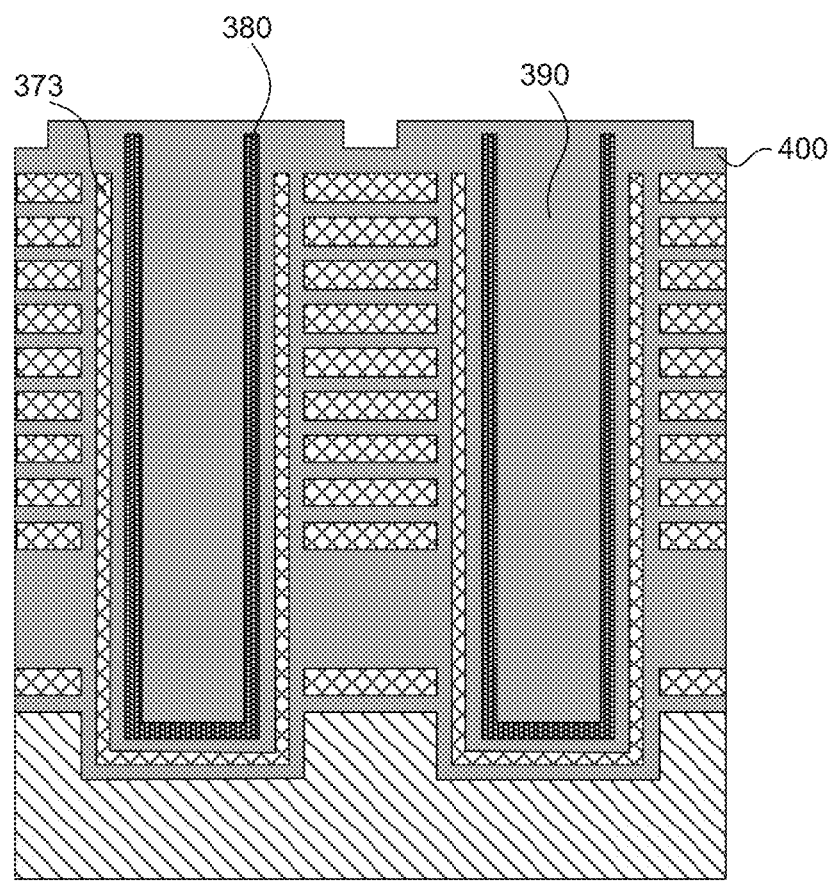

Referring back to FIG. 4, the method can process to operation S407, in which a second insulation connection layer 400 can be formed to cover the top surfaces of the second alternating dielectric stack 320 and the second functional layers. Specifically, a deposition process can be performed to deposit the second insulation connection layer 400, such as an oxide layer. As such, the gaps formed by removing the upper portions of the of the second storage layers 373 can be filled up, and the top surfaces of the second alternating dielectric stack 320, the second functional layers, and the second filling structures 390 can be covered, as shown in FIG. 5F.

Figure 5G:
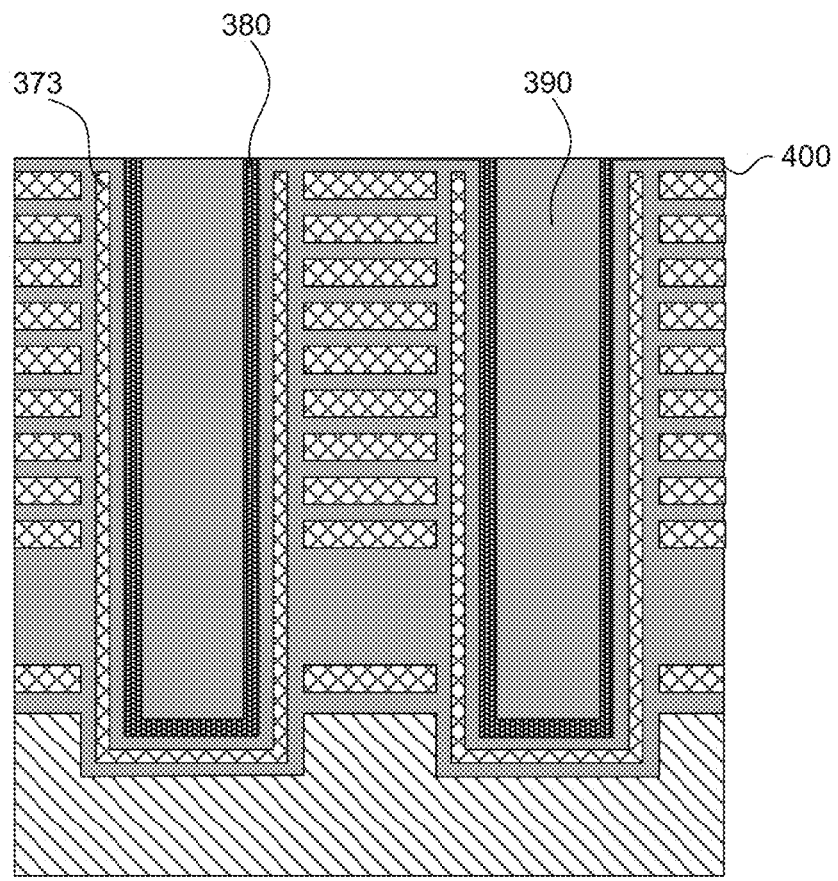

A following chemical mechanical polishing (CMP) process can be performed to remove the upper portion of the second insulation connection layer 400. As such, the top surfaces of the second insulation connection layer 400, the second channel layers 380, and the second filling structures 390 can be planarized and in a same level, and the top surface of the second storage layers 373 of the second functional layer in each second channel hole 340 can be covered by the second insulation connection layer 400, as shown in FIG. 5G.

Figure 5H:
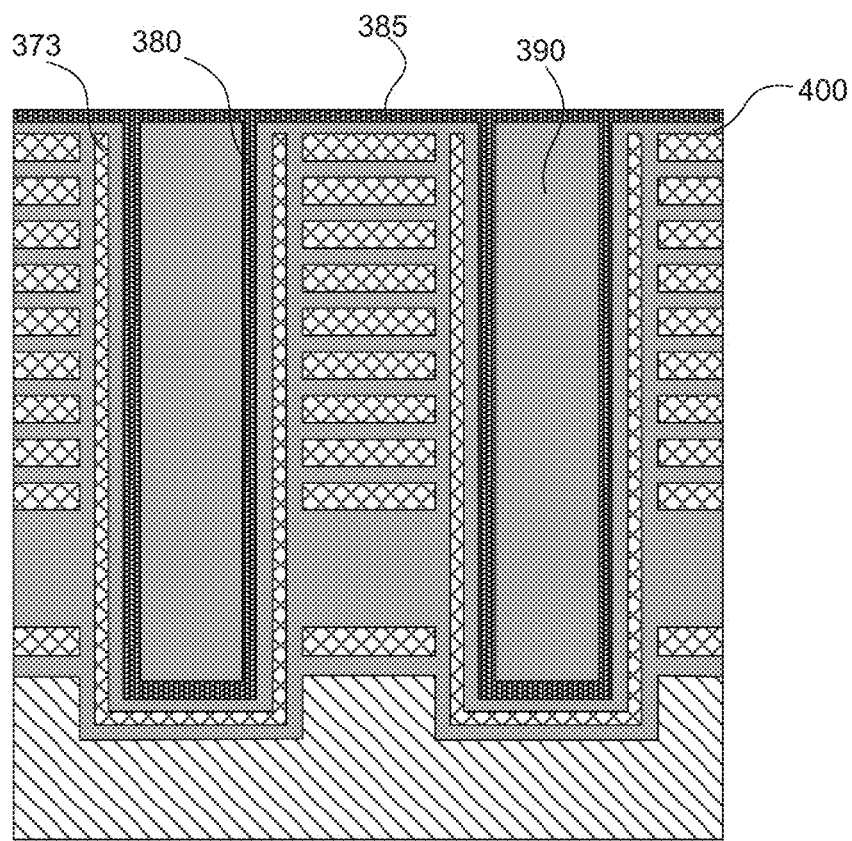

Referring back to FIG. 4, the method can process to operation S408, in which a second channel connection layer 385 can be formed on the second insulation connection layer. As shown in FIG. 5H, the second channel connection layer 385 can be formed on the second insulation connection layer 400 and in contact with the second channel layer 380 in each second channel hole 340. In some embodiments, the second channel connection layer 385 can be an amorphous silicon layer or a polysilicon layer formed by using a thin film deposition process, such as ALD, CVD, PVD, or any other suitable process. It is noted that, the second channel connection layer 385 is insulated from the second storage layers 373 of the second functional layer in each second channel hole 340 through the second insulation connection layer 400.

Referring back to FIG. 4, the method can process to operation S409, in which portions of the second channel connection layer 385 can be removed, such that the remaining portions of the second channel connection layer 385 can form multiple second channel connection structure 387. The second channel connection structure 387 can be located above the second storage layers 373 and the second tunneling layers 375 in the second functional layers, and the second channel layers 380.

Figure 5I:
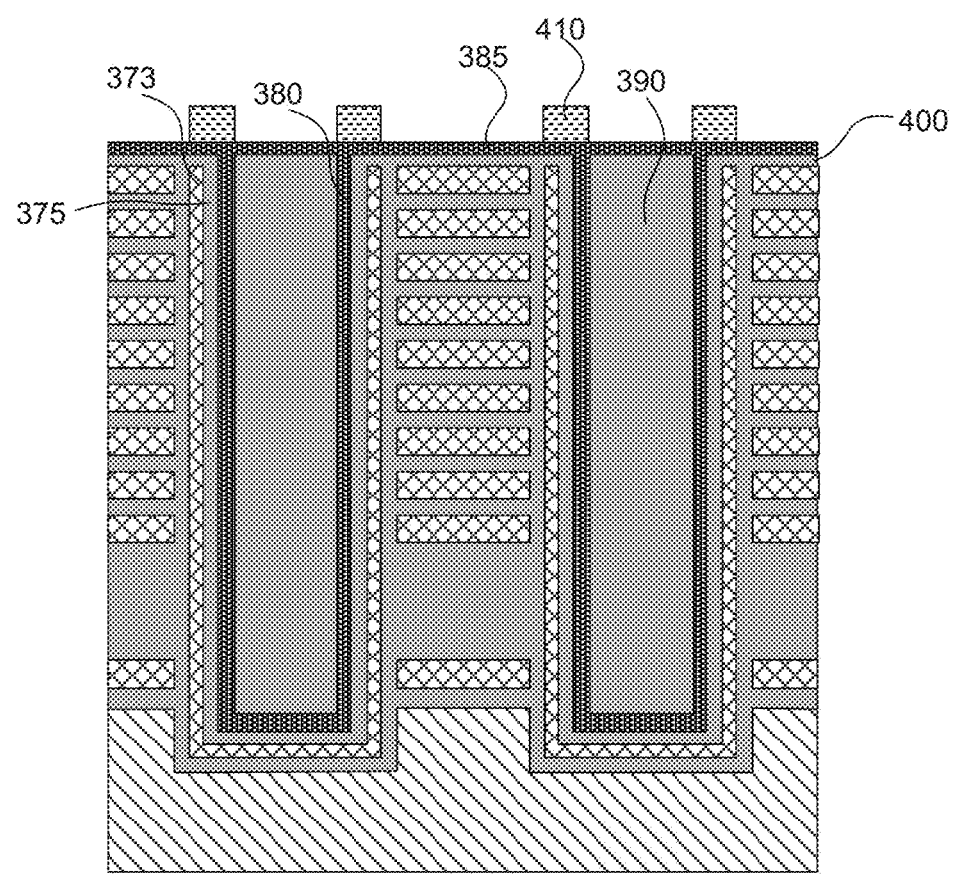

Specifically, a photoresist layer 410 can be coated on the second channel connection layer 385. The photoresist layer 410 can be patterned to expose the portions of the second channel connection layer 385 that are above the second alternating dielectric stack 320, the second barrier layers 371 in the second functional layers, and the second filling structures 390, as shown in FIG. 5I. Using the patterned photoresist layer 410 as a mask, an etching process can be performed to remove the exposed portions of the second channel connection layer 385.

Figure 5J:
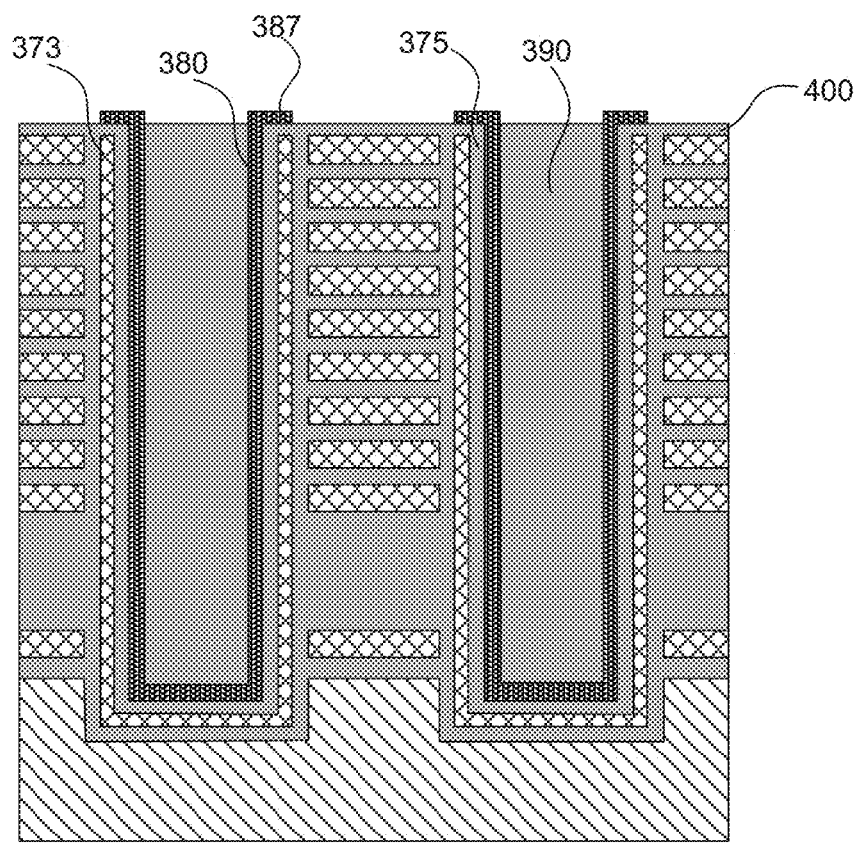

Then the patterned photoresist layer 410 can be removed. The remaining portions of the second channel connection layer 385 above the second storage layers 373 and the second tunneling layers 375 in the second functional layers, and the second channel layers 380 can form multiple second channel connection structures 387, as shown in FIG. 5J. Each of the multiple second channel connection structures 387 can have a ring shape. A width of the ring can equal to a summation of the thickness of the second storage layers 373, the thickness of the second tunneling layer 375 of the first functional layer, and the thickness of the second channel layer 380.

Figure 5K:
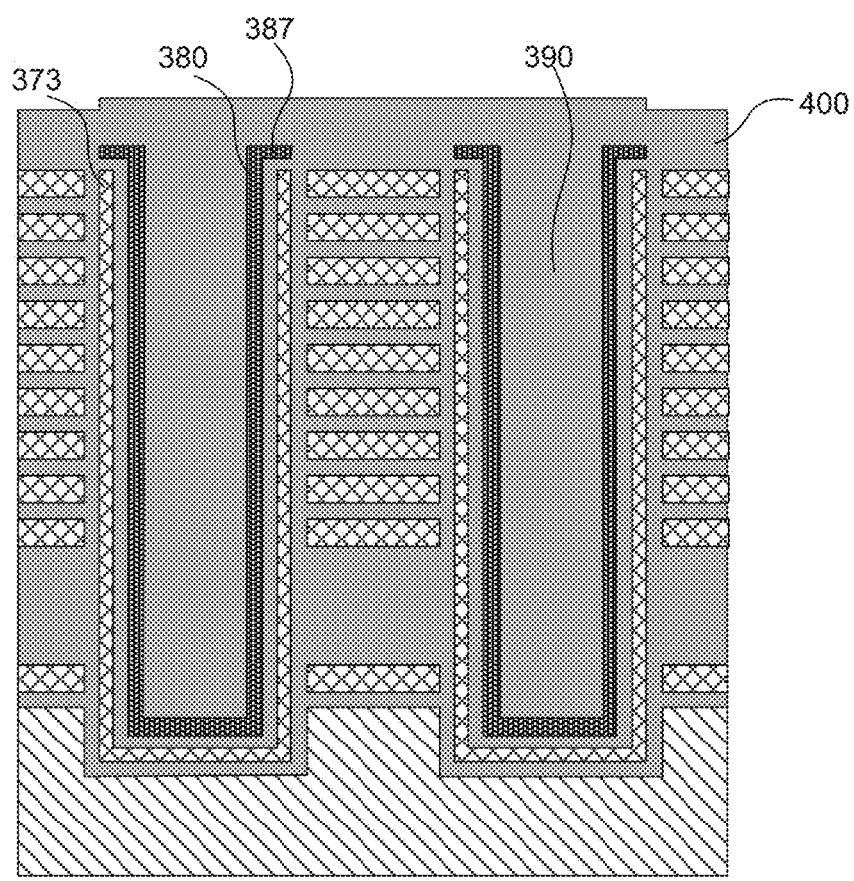
Figure 5L:
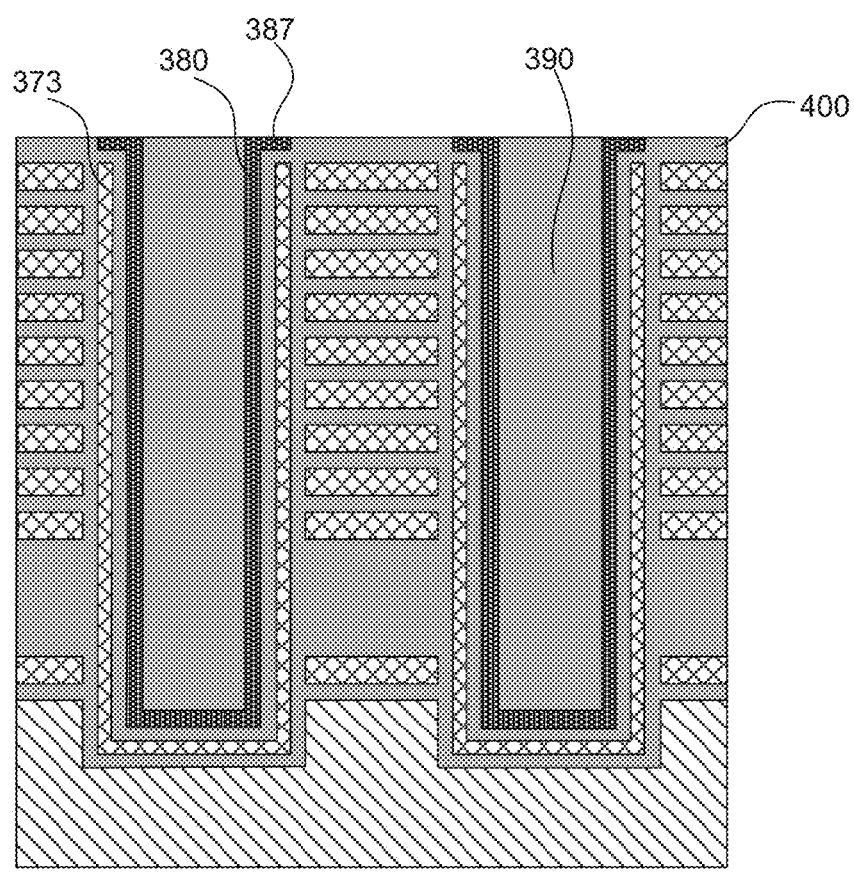

As shown in FIG. 5K, a deposition process can be performed to increase the thickness of the second insulation connection layer 400, such that the top surface of the multiple second channel connection structures 387 can be covered by the second insulation connection layer 400. A following chemical mechanical polishing (CMP) process can be performed to remove the upper portion of the second insulation connection layer 400. As such, the top surface of the multiple second channel connection structures 387 can be exposed. The top surfaces of the second insulation connection layer 400, the multiple second channel connection structures 387, and the second filling structures 390 can be planarized and in a same level, as shown in FIG. 5L.

Figure 6:
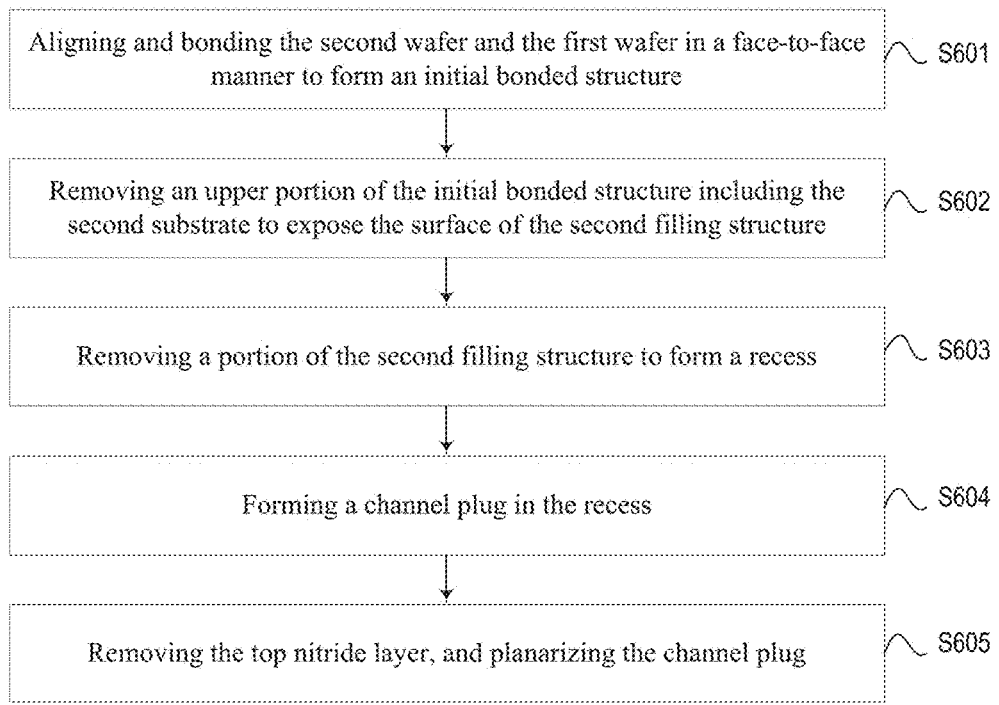
FIG. 6 illustrates a flow diagram of an exemplary method for bonding a connecting wafer to a device wafer in accordance with some embodiments of the present disclosure.

Referring to FIG. 6, a flow diagram of an exemplary method for bonding a connecting wafer to a device wafer is shown in accordance with some embodiments of the present disclosure. FIGS. 7A-7G illustrate cross-sectional views of an exemplary 3D memory device at certain fabricating stages of the method shown in FIG. 6. It is noted that, the device wafer is also referred to the first wafer, as shown in FIG. 3M described above, while the connecting wafer is also referred to the second wafer, as shown in FIG. 5L described above.

As shown in FIG. 6, the method can start at operation S601, in which the second wafer and the first wafer can be aligned and bonded together in a face-to-face manner to form an initial bonded structure. As such, the first channel layer in each first channel hole in the first wafer can be electrically connected with the second channel layer in the corresponding second channel hole in the second wafer.

Figure 7A:
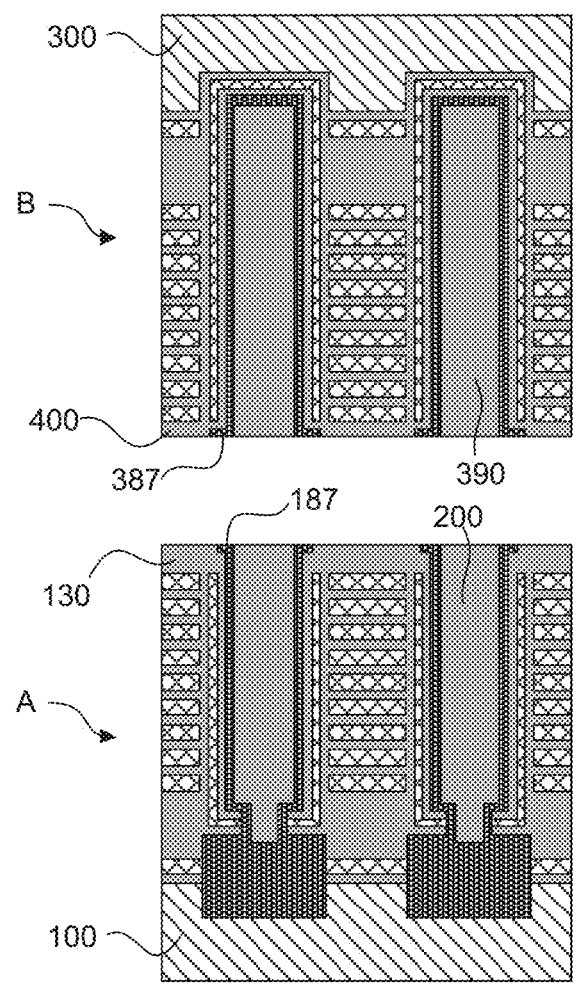
FIGS. 7A-7G illustrate cross-sectional views of an exemplary 3D memory device at certain fabricating stages of the method shown in FIG. 6 in accordance with some embodiments of the present disclosure.

As shown in FIG. 7A, the second wafer B formed by using the method described above in connection with FIGS. 5A-5L can be flipped upside down, and positioned above the first wafer A formed by using the method described above in connection with FIGS. 3A-3M. The second wafer B can be aligned with the first wafer A, such that each of the multiple first upper channel connection structures 187 on the first wafer A can be aligned to the corresponding one of the multiple second channel connection structures 387 on the second wafer B. As a result, each first upper channel connection structure 187 can contact the corresponding second channel connection structure 387 when the second wafer B is bonded with the first wafer A.

The first upper channel connection structure 187 and the corresponding second channel connection structure 387 can be joined with the corresponding second channel connection structure 387 by flip-chip bonding the first wafer A and the second wafer B. As shown in FIG. 7A, a first interconnect surface of the first wafer A can include the exposed surfaces of the multiple first upper channel connection structures 187, the multiple first filling structures 200, and the first insulating connection layer 130, while a second interconnect surface of the second wafer B can include the exposed surfaces of the multiple second channel connection structures 387, the multiple second filling structures 390, and the second insulating connection layer 400. In some embodiments, the first wafer A and the second wafer B can be hybrid bonded in a face-to-face manner, such that the first interconnect surface of the first wafer A can be hybrid bonded with the second interconnect surface of the second wafer B.

Figure 7B:
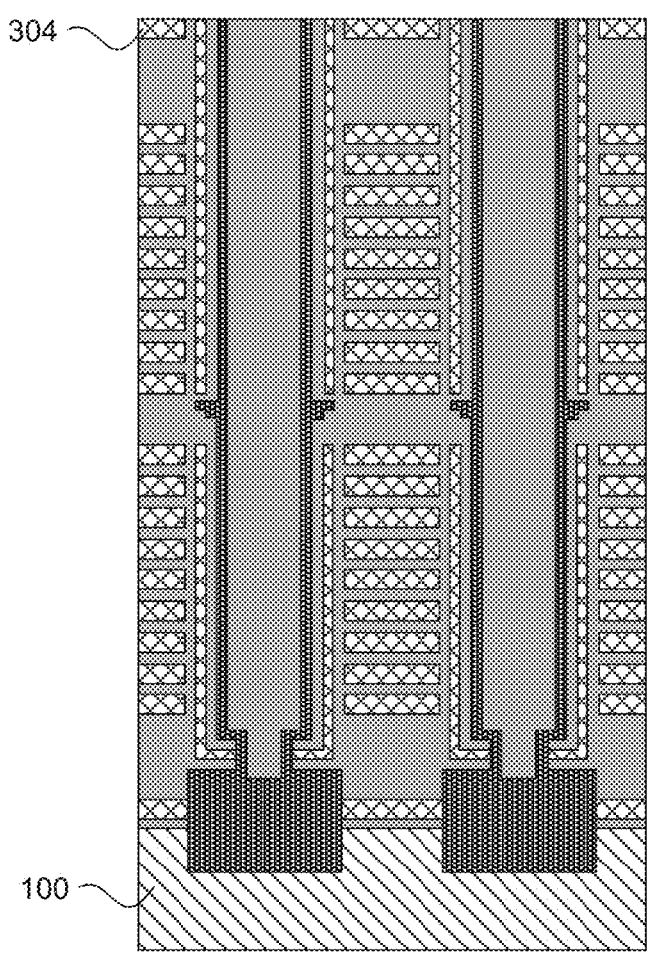

Hybrid bonding (also known as "metal/dielectric hybrid bonding") can be a direct bonding technology (e.g., forming bonding between surfaces without using intermediate layers, such as solder or adhesives), which obtains metal-metal bonding and dielectric-dielectric bonding simultaneously. As illustrated in FIG. 7B, each first upper channel connection structure 187 is in contact with the corresponding second channel connection structure 387, the first insulating connection layer 130 is in contact with the second insulation connection layer 400, and each first filling structure 200 is in contact with the corresponding second filling structure 390. That is, a bonding interface can be formed between the first interconnect surface of the first wafer A and the second interconnect surface of the second wafer B.

In some embodiments, a treatment process can be performed to the first interconnect surface of the first wafer A and the second interconnect surface of the second wafer B to enhance the bonding strength of the bonding interface. For example, the treatment process can include a plasma treatment to treat the first interconnect surface of the first wafer A and the second interconnect surface of the second wafer B, such that the first interconnect surface of the first wafer A and the second interconnect surface of the second wafer B form chemical bonds. As another example, the treatment process can further include a wet process that treats the first interconnect surface of the first wafer A and the second interconnect surface of the second wafer B, such that the dielectric layers (e.g., the first insulating connection layer 130, the second insulation connection layer 400, the first filling structures 200, and the second filling structures 390) can form preferable chemical bonds to enhance the bonding strength of the bonding interface. As yet another example, the treatment process can further include a thermal process that can be performed at a temperature from about 250° C. to about 600° C. The thermal process can cause inter-diffusion between conductor layers. As a result, the conductor layers (e.g., the first upper channel connection structures 187 and the second channel connection structures 387) can be inter-mixed with each other after the joining process.

Referring back to FIG. 6, the method can process to operation S602, in which an upper portion of the initial bonded structure including the second substrate 200 can be removed to expose surfaces of the multiple second filling structures 390. As shown in FIG. 7B, a chemical mechanical polishing (CMP) process can be performed to remove the upper portion of the initial bonded structure including the second substrate 300, such that the top nitride layer 304 and the surfaces of the multiple second filling structures 390 are exposed. It is noted that, the relative position terms and/or direction terms such as "top," "bottom," "above," "below," etc., used herein in connection with the method shown in FIGS. 6 and 7A-7G are with respect to the first substrate 100.

Figure 7C:
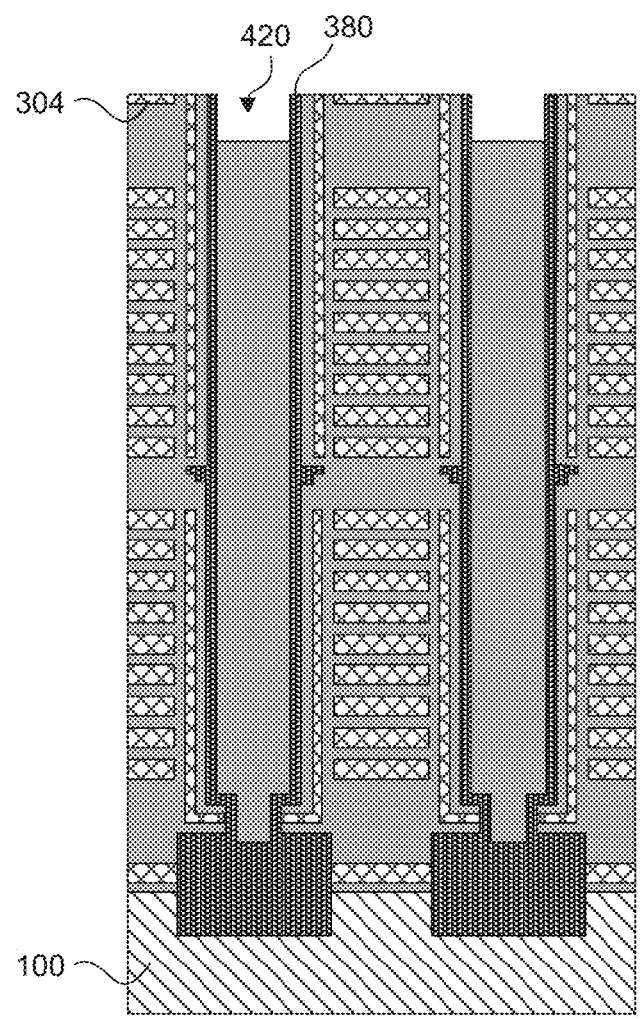

Referring back to FIG. 6, the method can process to operation S603, in which a portion of each second filling structure 390 can be removed to form a fourth recess 420 in each second channel hole 340. As shown in FIG. 7C, an upper portion of the second filling structure 390 in each second channel hole 340 can be removed, so that the top surface of the remaining portion of each second filling structure 390 can be lower than the the top nitride layer 304. As such, a fourth recess 420 can be formed in the upper portion of each second channel hole 340 to expose an upper portion of the sidewalls of the second channel layer 380. In some embodiments, the upper portion of the second filling structure 390 can be removed by using a recess etching process including, but not limit to, a wet etching, a dry etching, or a combination thereof.

Figure 7D:
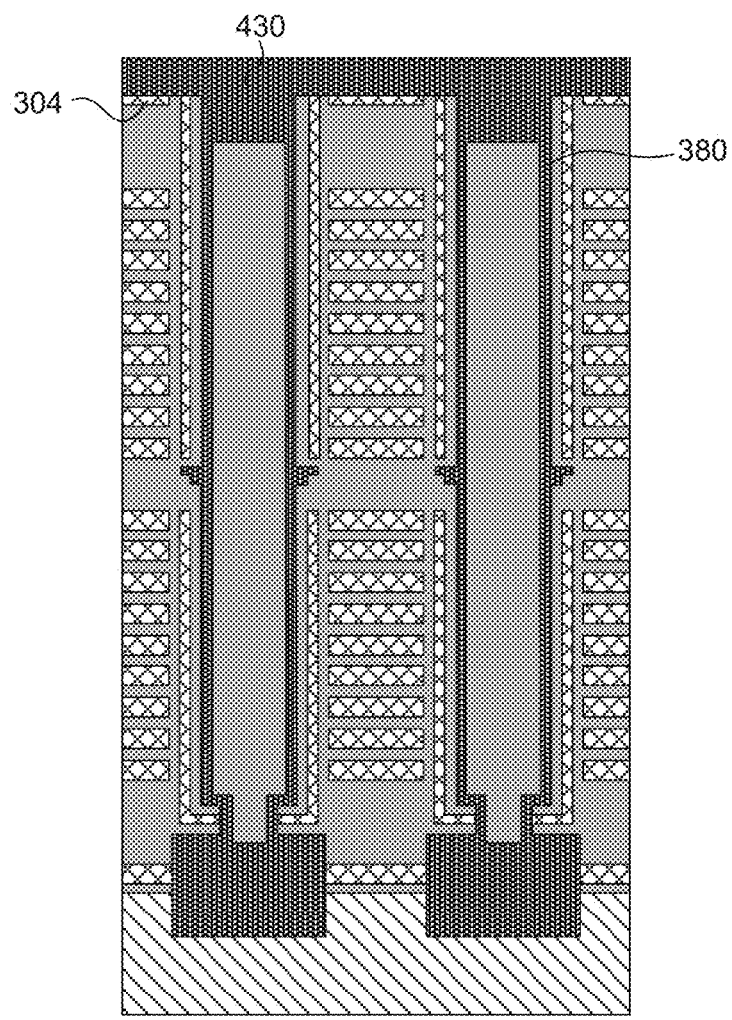
Figure 7E:
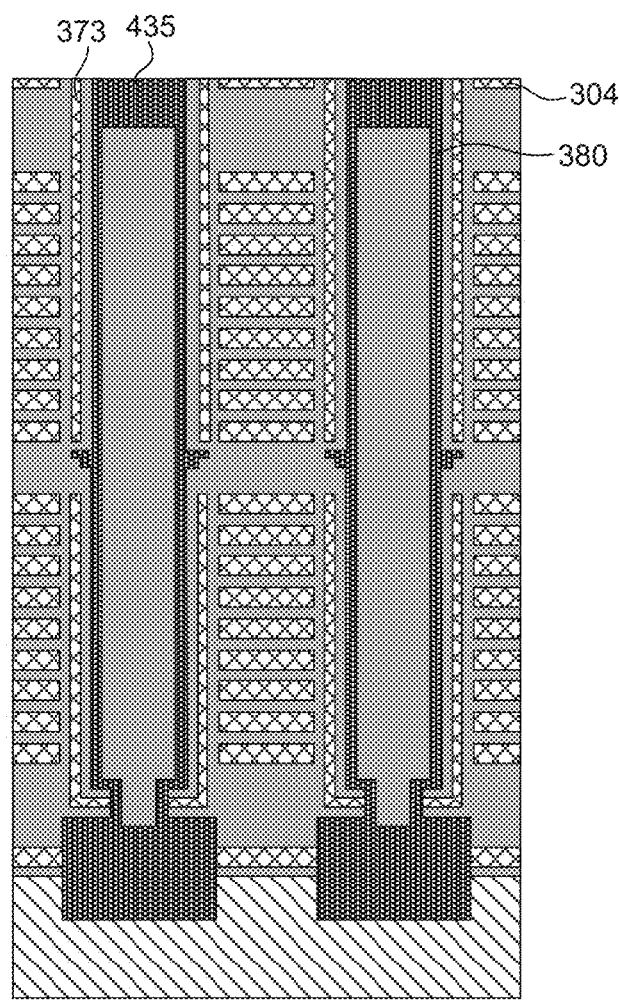

Referring back to FIG. 6, the method can process to operation S604, in which a channel plug can be formed in each of the multiple fourth recess 420. In some embodiments, a channel plug layer 430 can be an amorphous silicon layer or polysilicon layer formed by using a single deposition process. As shown in FIG. 7D, the channel plug layer 430 can contact with the second channel layer 380 in each second channel hole 340. In some embodiments, the channel plug layer 430 covers the surface of the top nitride layer 304. The portion of the channel plug layer 430 outside the second channel holes 340 can be removed by a chemical mechanical polishing (CMP) process. As such, a channel plug 435 can be formed in each of the multiple fourth recesses 420, as shown in FIG. 7E.

Figure 7F:
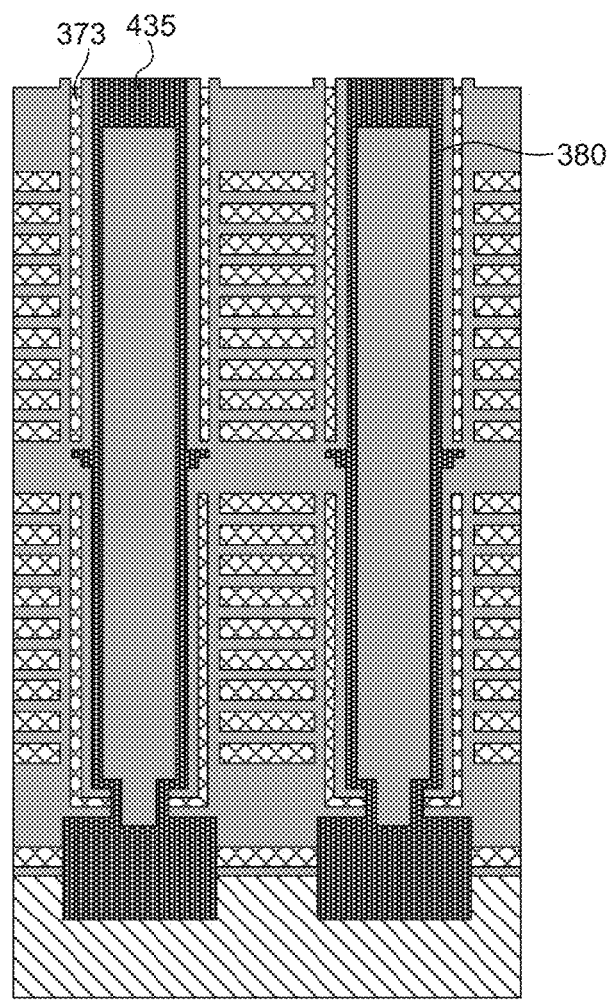
Figure 7G:
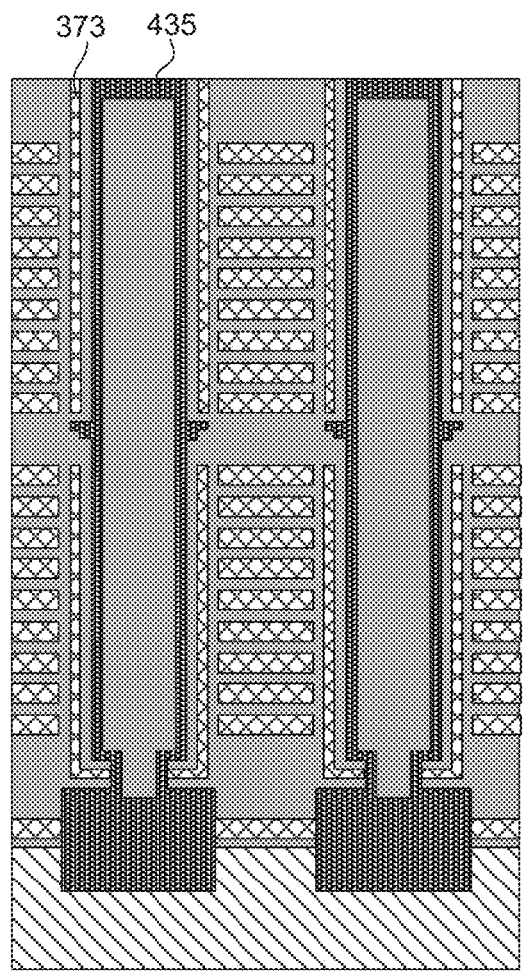

Referring back to FIG. 6, the method can process to operation S605, in which the top nitride layer can be removed, and the multiple channel plugs 435 can be planarized. As shown in FIG. 7F, the top nitride layer 304 can be removed by any suitable etching process, such as a wet etching process. A following chemical mechanical polishing (CMP) process can be performed to planarize the top surfaces of the multiple channel plugs 435 and the second filling structures 390, as shown in FIG. 7G.

Figure 8:
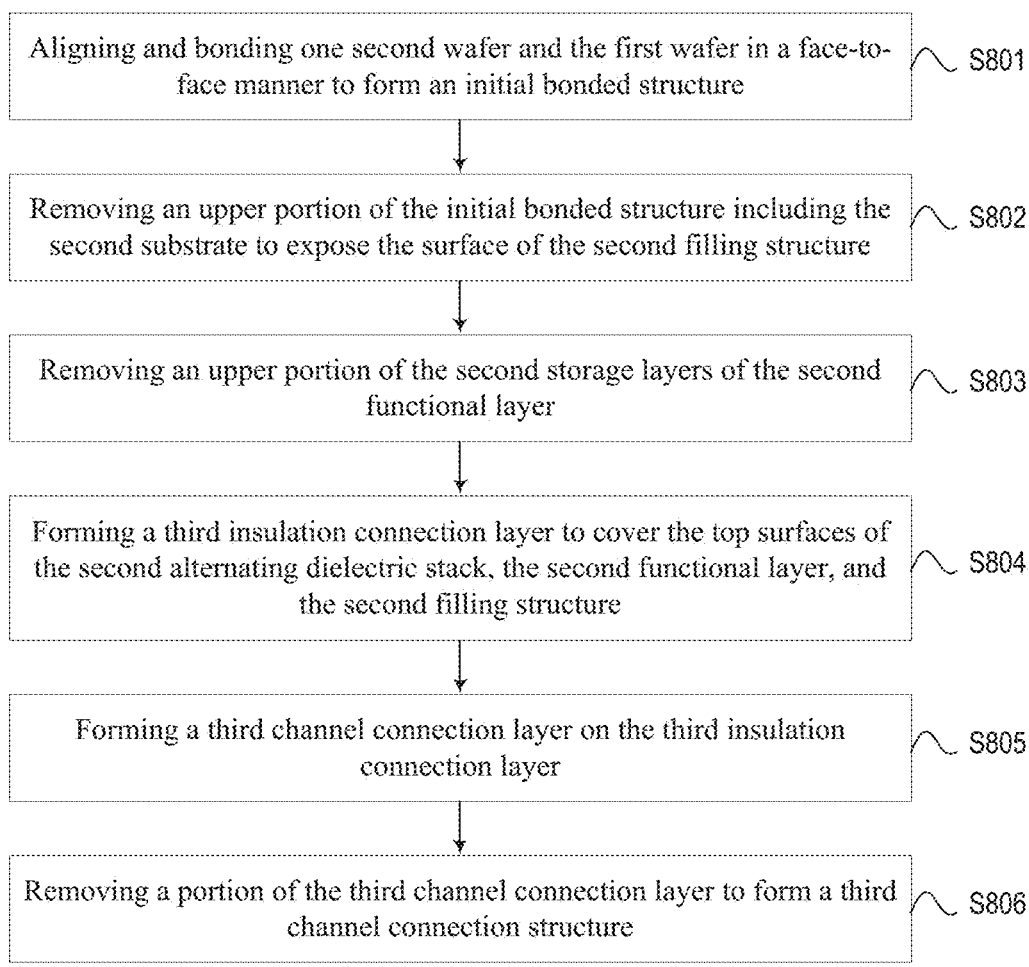
FIG. 8 illustrates a flow diagram of an exemplary method for bonding two or more connecting wafers to a device wafer in accordance with some embodiments of the present disclosure.

Referring to FIG. 8, a flow diagram of an exemplary method for bonding two or more connecting wafers to a device wafer is shown in accordance with some embodiments of the present disclosure. FIGS. 9A-9J illustrate cross-sectional views of an exemplary 3D memory device at certain fabricating stages of the method shown in FIG. 8. It is noted that, the device wafer is also referred to the first wafer, as shown in FIG. 3M described above, while the connecting wafer is also referred to the second wafer, as shown in FIG. 5L described above.

As shown in FIG. 8, the method can start at operation S801, in which one second wafer and the first wafer can be aligned and bonded together in a face-to-face manner to form an initial bonded structure. As such, the first channel layer in each first channel hole in the first wafer can be electrically connected with the second channel layer in the corresponding second channel hole in the second wafer.

Figure 9A:
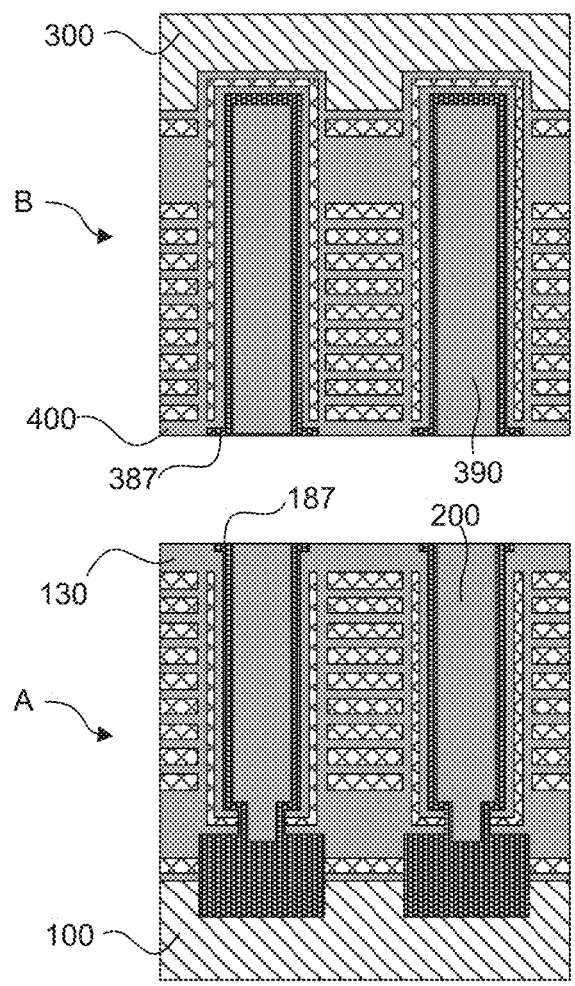
FIGS. 9A-9J illustrate cross-sectional views of an exemplary 3D memory device at certain fabricating stages of the method shown in FIG. 8 in accordance with some embodiments of the present disclosure.

As shown in FIG. 9A, one second wafer B formed by using the method described above in connection with FIGS. 5A-5L can be flipped upside down, and positioned above the first wafer A formed by using the method described above in connection with FIGS. 3A-3M. The second wafer B can be aligned with the first wafer A, such that each of the multiple first upper channel connection structures 187 on the first wafer A can be aligned to the corresponding one of the multiple second channel connection structures 387 on the second wafer B. As a result, each first upper channel connection structure 187 can contact the corresponding second channel connection structure 387 when the second wafer B is bonded with the first wafer A.

The first upper channel connection structure 187 and the corresponding second channel connection structure 387 can be joined with the corresponding second channel connection structure 387 by flip-chip bonding the first wafer A and the second wafer B. As shown in FIG. 9A, a first interconnect surface of the first wafer A can include the exposed surfaces of the multiple first upper channel connection structures 187, the multiple first filling structures 200, and the first insulating connection layer 130, while a second interconnect surface of the second wafer B can include the exposed surfaces of the multiple second channel connection structures 387, the multiple second filling structures 390, and the second insulating connection layer 400.

Figure 9B:
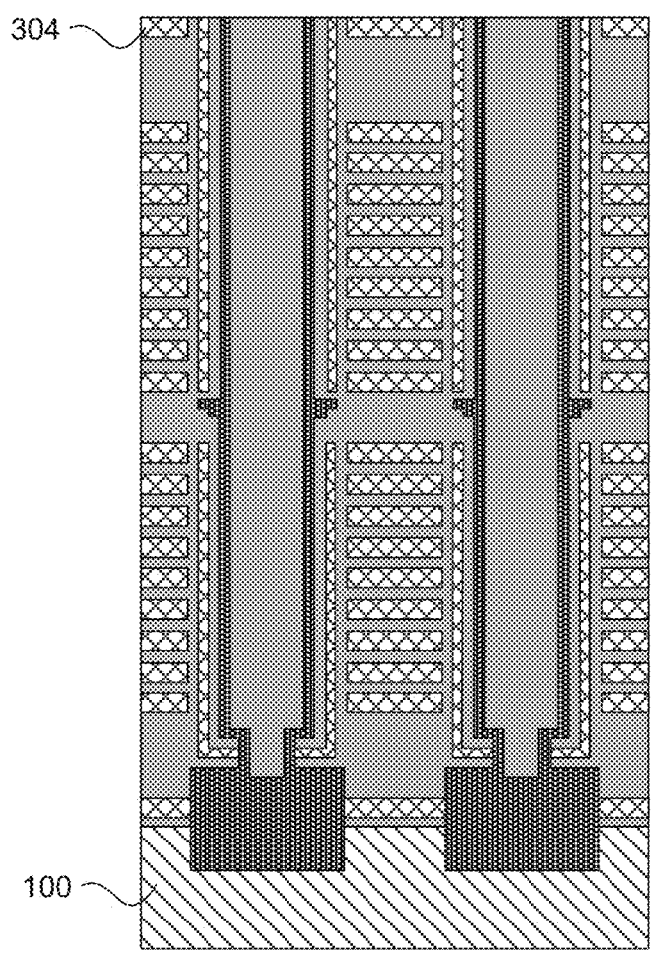

In some embodiments, the first wafer A and the second wafer B can be hybrid bonded in a face-to-face manner, such that the first interconnect surface of the first wafer A can be hybrid bonded with the second interconnect surface of the second wafer B. As illustrated in FIG. 9B, each first upper channel connection structure 187 is in contact with the corresponding second channel connection structure 387, the first insulating connection layer 130 is in contact with the second insulation connection layer 400, and each first filling structure 200 is in contact with the corresponding second filling structure 390. That is, a bonding interface can be formed between the first interconnect surface of the first wafer A and the second interconnect surface of the second wafer B.

In some embodiments, a treatment process can be performed to the first interconnect surface of the first wafer A and the second interconnect surface of the second wafer B to enhance the bonding strength of the bonding interface. For example, the treatment process can include a plasma treatment to treat the first interconnect surface of the first wafer A and the second interconnect surface of the second wafer B, such that the first interconnect surface of the first wafer A and the second interconnect surface of the second wafer B form chemical bonds. As another example, the treatment process can further include a wet process that treats the first interconnect surface of the first wafer A and the second interconnect surface of the second wafer B, such that the dielectric layers (e.g., the first insulating connection layer 130, the second insulation connection layer 400, the first filling structures 200, and the second filling structures 390) can form preferable chemical bonds to enhance the bonding strength of the bonding interface. As yet another example, the treatment process can further include a thermal process that can be performed at a temperature from about 250° C. to about 600° C. The thermal process can cause inter-diffusion between conductor layers. As a result, the conductor layers (e.g., the first upper channel connection structures 187 and the second channel connection structures 387) can be inter-mixed with each other after the joining process.

Referring back to FIG. 8, the method can process to operation S802, in which an upper portion of the initial bonded structure including the second substrate 200 can be removed to expose surfaces of the multiple second filling structures 390. In some embodiments, one or more chemical mechanical polishing (CMP) processes can be performed to remove the upper portion of the initial bonded structure including the second substrate 300.

In some embodiments, as shown in FIG. 9B, the top nitride layer 304 and the surfaces of the multiple second filling structures 390 are exposed. The top surfaces of the second functional layer, the second channel layer 380, and the second filling structures 390 can be planarized in a same level as the top surface of the top nitride layer 304 of the second alternating dielectric stack 320.

Figure 9C:
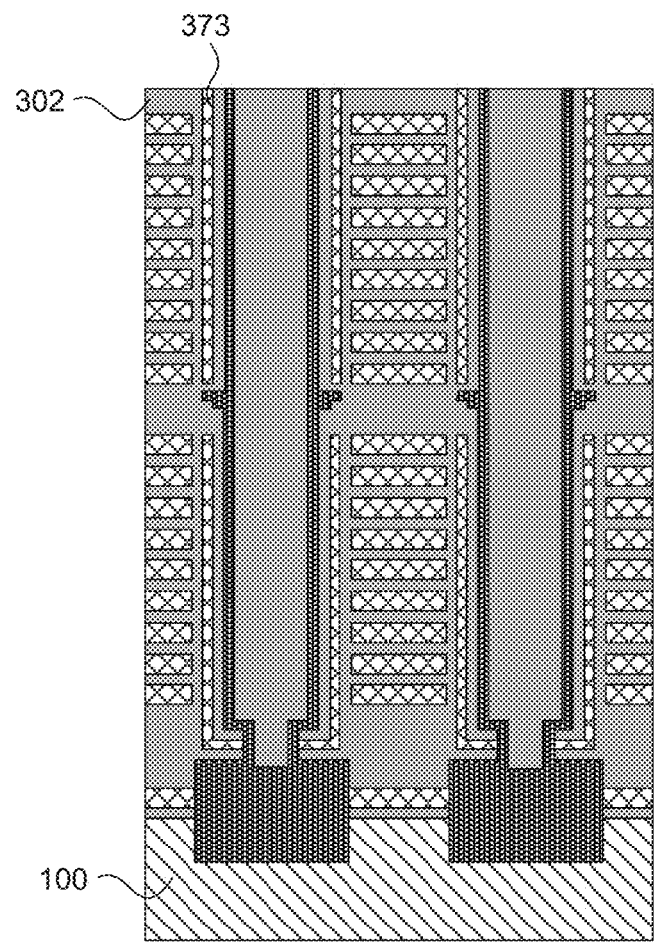

In some other embodiments, as shown in FIG. 9C, the top nitride layer 304 of the second alternating dielectric stack 320 can be etched to expose the surface of the top oxide layer 302 of the second alternating dielectric stack 320. The top surfaces of the second functional layer, the second channel layer 380, and the second filling structures 390 can be planarized in a same level as the top surface of the top oxide layer 302 of the second alternating dielectric stack 320.

Figure 9D:
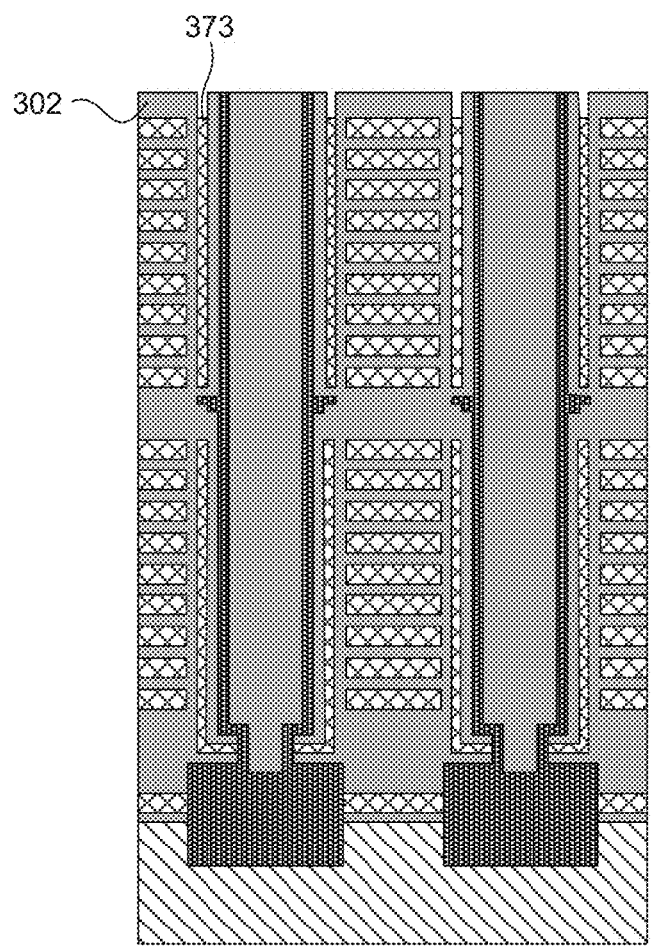

Referring back to FIG. 8, the method can process to operation S803, in which an upper portion of the second storage layers 373 of the second functional layer in each second channel hole 340 can be removed. In some embodiments, a wet etching process can be performed to remove the upper portion of the second storage layers 373 of the second functional layer in each second channel hole 340, as shown in FIG. 9D. In some embodiments, the top nitride layer 304 of the second alternating dielectric stack 320 can be also removed in the same wet etching process.

Figure 9E:
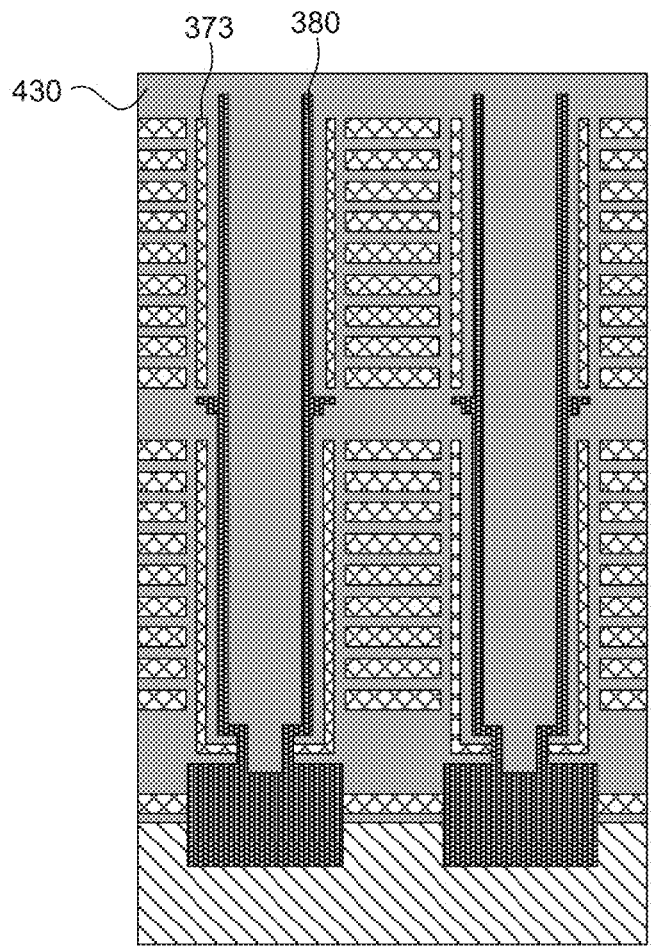

Referring back to FIG. 8, the method can process to operation S804, in which a third insulation connection layer 430 can be formed to cover the top surfaces of the second alternating dielectric stack 320, the second functional layers, and the second filling structures 390. Specifically, a deposition process can be performed to deposit the third insulation connection layer 430, such as an oxide layer. As such, the gaps formed by removing the upper portions of the of the second storage layers 373 can be filled up, and the top surfaces of the second alternating dielectric stack 320, the second functional layers, and the second filling structures 390 can be covered, as shown in FIG. 9E.

Figure 9F:
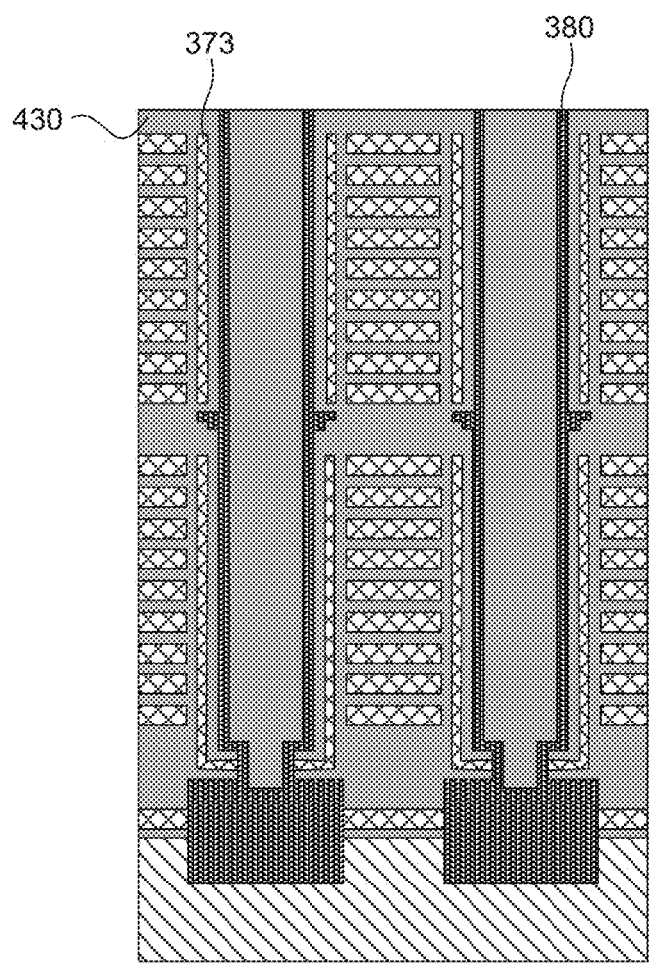

A following chemical mechanical polishing (CMP) process can be performed to remove the upper portion of the third insulation connection layer 430. As such, the top surfaces of the third insulation connection layer 430, the second channel layers 380, and the second filling structures 390 can be planarized and in a same level, and the top surface of the second storage layers 373 of the second functional layer in each second channel hole 340 can be covered by the third insulation connection layer 430, as shown in FIG. 9F.

Figure 9G:
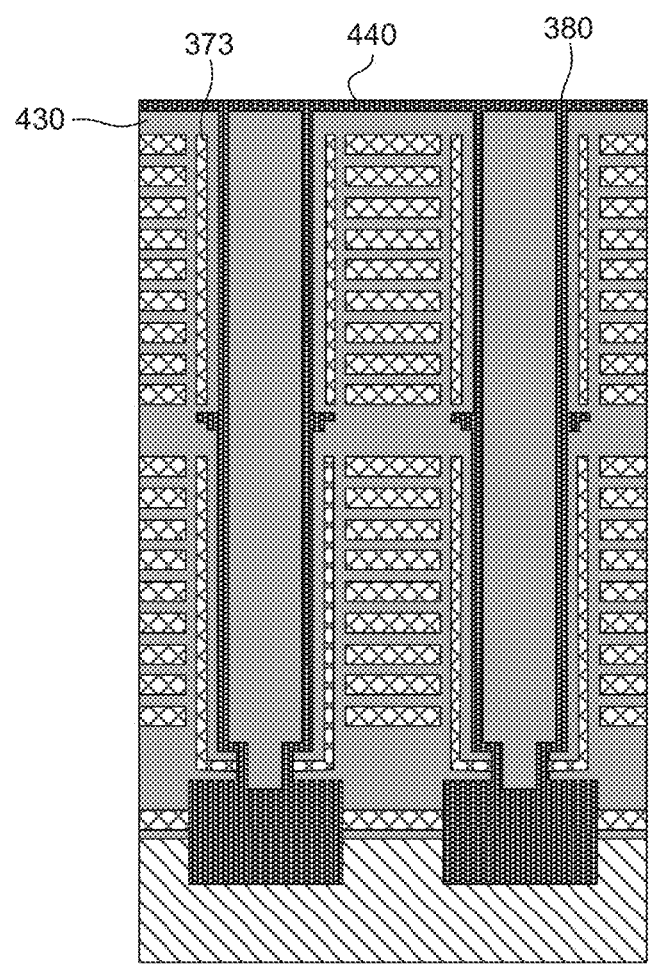

Referring back to FIG. 8, the method can process to operation S805, in which a third channel connection layer 440 can be formed on the third insulation connection layer. As shown in FIG. 9G, the third channel connection layer 440 can be formed on the third insulation connection layer 430 and in contact with the second channel layer 380 in each second channel hole 340. In some embodiments, the third channel connection layer 440 can be an amorphous silicon layer or a polysilicon layer formed by using a thin film deposition process, such as ALD, CVD, PVD, or any other suitable process. It is noted that, the third channel connection layer 440 is insulated from the second storage layers 373 of the second functional layer in each second channel hole 340 through the third insulation connection layer 430.

Referring back to FIG. 8, the method can process to operation S806, in which portions of the third channel connection layer 440 can be removed, such that the remaining portions of the third channel connection layer 440 can form multiple third channel connection structures 445. The third channel connection structure 445 can be located above the second storage layers 373 and the second tunneling layers 375 in the second functional layers, and the second channel layers 380.

Figure 9H:
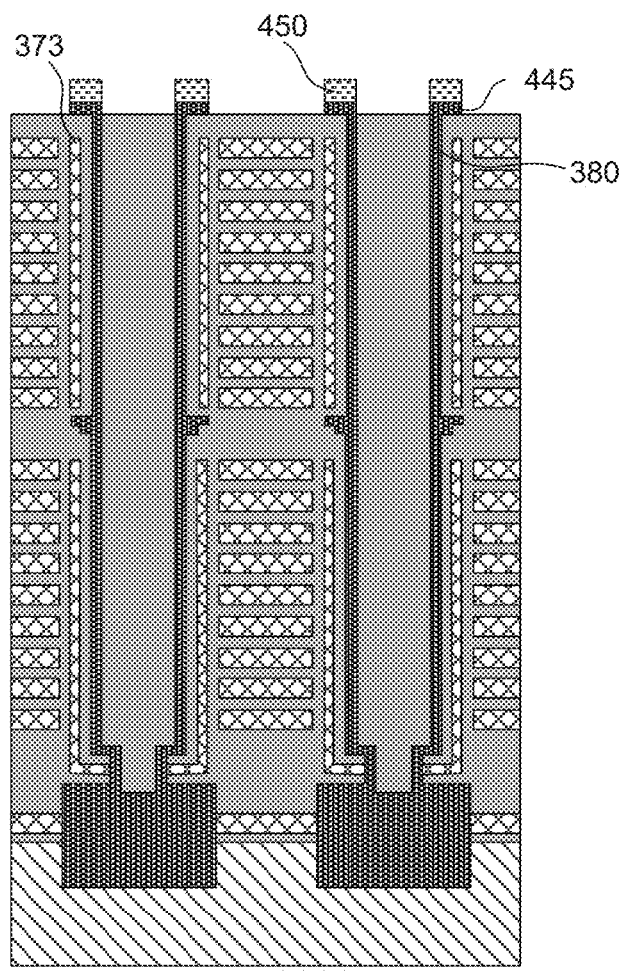

Specifically, a photoresist layer 450 can be coated on the third channel connection layer 385. The photoresist layer 450 can be patterned to expose the portions of the third channel connection layer 440 that are above the second alternating dielectric stack 320, the second barrier layers 371 in the second functional layers, and the second filling structures 390, as shown in FIG. 9H. Using the patterned photoresist layer 450 as a mask, an etching process can be performed to remove the exposed portions of the third channel connection layer 440.

Then the patterned photoresist layer 450 can be removed. The remaining portions of the third channel connection layer 440 above the second storage layers 373 and the second tunneling layers 375 in the second functional layers, and the second channel layers 380 can form multiple third channel connection structures 445, as shown in FIG. 9H. Each of the multiple third channel connection structures 445 can have a ring shape. A width of the ring can equal to a summation of the thickness of the second storage layers 373, the thickness of the second tunneling layer 375 of the first functional layer, and the thickness of the second channel layer 380.

Figure 9I:
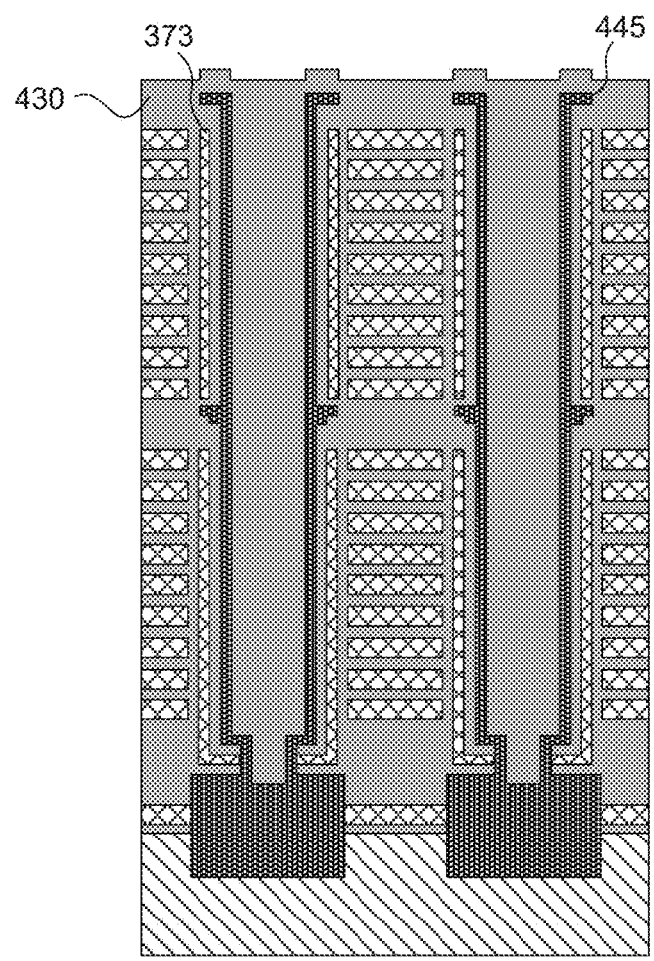
Figure 9J:
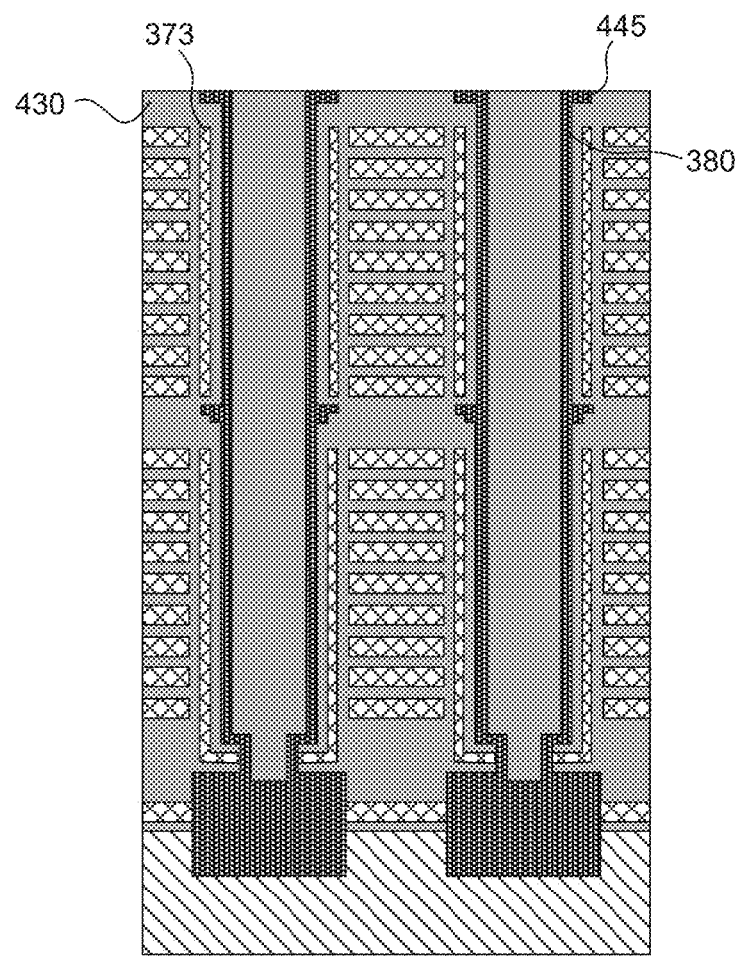

As shown in FIG. 9I, a deposition process can be performed to increase the thickness of the third insulation connection layer 430, such that the top surface of the multiple third channel connection structures 445 can be covered by the third insulation connection layer 430. A following chemical mechanical polishing (CMP) process can be performed to remove the upper portion of the third insulation connection layer 430, as shown in FIG. 9J. As such, the top surface of the multiple third channel connection structures 445 can be exposed. The top surfaces of the third insulation connection layer 430, the multiple third channel connection structures 445, and the second filling structures 390 can be planarized and in a same level.

As shown in FIG. 9J, the planarized surface including the top surfaces of the third insulation connection layer 430, the multiple third channel connection structures 445, and the second filling structures 390 can be used as a third interconnect surface of the second wafer B to be joined with a fourth interconnect surface of another second wafer B. If one second wafer B is to be further bonded with the "A+B" structure that is shown in FIG. 9J, the method described above in connection with FIGS. 6 and 7A-7G can be repeated to form an "A+B+B" structure. If two or more second wafer B is to be further bonded with the "A+B" structure that is shown in FIG. 9J, the method described above in connection with FIGS. 6 and 7A-7G can be repeated to form a "A+B+B+B . . . " structure.

Further, it is noted that, subsequent processes can be performed to further fabricate the 3D memory device. For example, a metal via can be formed on one top channel plug 435 as shown in FIG. 7G for electronically connecting the top channel plug 435 to back end of line (BEOL) metal lines, such as bit lines of double patterning structure.

In some embodiments, a gate replacement process (also known as the "word line replacement" process) can be performed to replace second dielectric layers 104 and 304 (e.g., silicon nitride) of the first alternating dielectric stack 120 and the second alternating dielectric stack(s) 320 with conductor layers (e.g., W). In some embodiments, the gate replacement process can be performed to each wafer (e.g., the first wafer A and each of the second wafers B) before the bonding process. In some other embodiments, the gate replacement process can be can be performed to the bonded structure after the entire or at least a part of the bonding process.

As a result, after the gate replacement process, the alternating dielectric stacks can become alternating conductor/dielectric stacks. The replacement of second dielectric layers 104 with conductor layers can be performed by wet etching first dielectric layers (e.g., silicon nitride) selective to second dielectric layers (e.g., silicon oxide) and filling the structure with conductor layers (e.g., W). Conductor layers can be filled by PVD, CVD, ALD, any other suitable process, or any combination thereof. Conductor layers can include conductive materials including, but not limited to, W, Co, Cu, Al, polysilicon, silicides, or any combination thereof. It is noted that, both of the alternating dielectric stacks and the alternating conductor/dielectric stacks can be referred to alternating layer stacks.

Accordingly, methods for forming a dual-deck or multi-deck channel hole structure of a 3D memory device are disclosed. By performing two or more channel hole formation processes on two or more wafers and then bonding the two or more wafers, a dual-deck or multi-deck channel hole structure having a large aspect ratio and a limited top-bottom aperture error can be formed. By performing hybrid bonding process between wafers, the joined inter-deck channel connection structures can have a robust structure strength and a controlled thickness. As such, the channel mobility and the string current of the 3D memory device can be significantly improved. Further, the disclosed method can dramatically speed up the deep channel hole development, which results in an efficient process capability control, a simplified process complexity, and a reduced cost.

Disclosed is a method for forming a channel hole structure in a three-dimensional (3D) memory device. The method comprises forming a device wafer including: forming a first channel hole penetrating a first alternating layer stack of a device wafer, forming an epitaxial layer on a bottom of the first channel hole, and forming a first channel layer on a sidewall of the first channel hole. The method further comprises forming at least one connecting wafer, wherein each connecting wafer includes a second channel hole penetrating a second alternating layer stack without an epitaxial layer on a bottom of the second channel hole; and bonding the at least one connecting wafer and the device wafer, such that a second channel layer on a sidewall of the second channel hole in each connecting wafer is electrically connected with the first channel layer in the device wafer.

The method further comprises: forming a first interconnect surface including a top surface of a first channel connection structure on the device wafer, a width of the first channel connection structure being larger than a thickness of the first channel layer; forming a second interconnect surface including a top surface of a second channel connection structure on the connecting wafer, a width of the second channel connection structure being larger than a thickness of the second channel layer; and bonding a first connecting wafer and the device wafer, including: aligning the first channel connection structure of the device wafer and the second channel connection structure of the first connecting wafer, and bonding the first interconnect surface of the device wafer to the second interconnect surface of the first connecting wafer such that the first channel connection structure is in direct contact with the second channel connection structure.

In some embodiments, forming the device wafer further comprises: forming a first alternating dielectric stack and a first insulating connection layer on a first substrate; forming the first channel hole penetrating the first insulating connection layer and the first alternating dielectric stack; after forming the epitaxial layer on a bottom of the first channel hole, forming a first functional layer to cover a sidewall of the first channel hole; forming the first channel layer covering the first functional layer and in contact with the epitaxial layer; and forming the first channel connection structure above the first functional layer, the first channel connection structure being in contact with the first channel layer.

In some embodiments, forming the first functional layer comprises: forming a first barrier layer on the sidewall of the first channel hole for blocking an outflow of electronic charges; forming a first storage layer on a surface of the first barrier layer for storing electronic charges during operation of the 3D memory device; and forming a first tunneling layer on a surface of the first storage layer for tunneling electronic charges.

In some embodiments, forming the first channel connection structure comprises: forming a first channel connection layer on the first insulating connection layer, the first channel connection layer being in contact with the first channel layer; forming a first filling structure to fill the first channel hole; and patterning the first channel connection layer to remove a portion of the first channel connection layer to expose the first storage layer, the remaining portion of the first channel connection layer that is above the first tunneling layer and the first channel layer being the first channel connection structure.

In some embodiments, forming the first interconnect surface comprises: after patterning the first channel connection layer, removing an upper portion of the first storage layer; and refilling the first insulation connection layer and the first filling structure, such that top surfaces of the first insulation connection layer and the first filling structure are in level with the top surface of the first channel connection structure.

In some embodiments, forming each connecting wafer comprises: forming a second alternating dielectric stack on a second substrate; forming the second channel hole penetrating the second alternating dielectric stack; forming a second functional layer to cover a sidewall of the second channel hole; forming the second channel layer covering the second functional layer; forming a second filling structure to fill the second channel hole; and forming the second channel connection structure above the second functional layer, the second channel connection structure being in contact with the second channel layer.

In some embodiments, forming the first alternating dielectric stack or forming the second alternating dielectric stack comprises: forming a plurality of dielectric layer pairs stacked in a vertical direction, wherein each dielectric layer pair includes a first dielectric layer and a second dielectric layer that is different from the first dielectric layer.

In some embodiments, forming the second functional layer comprises: forming a second barrier layer on the sidewall of the second channel hole for blocking an outflow of electronic charges; forming a second storage layer on a surface of the second barrier layer for storing electronic charges during operation of the 3D memory device; and forming a second tunneling layer on a surface of the second storage layer for tunneling electronic charges.

In some embodiments, forming each connecting wafer further comprises: before forming the second channel connection structure, removing an upper portion of the first storage layer; and forming a second insulation connection layer to cover top surfaces of the second alternating dielectric stack and the second functional layer.

In some embodiments, forming the second channel connection structure comprises: forming a second channel connection layer on the second insulating connection layer, the second channel connection layer being in contact with the second channel layer and insulated with the second storage layer; and patterning the second channel connection layer to remove a portion of the second channel connection layer, the remaining portion of the second channel connection layer that is above the second tunneling layer and the second channel layer being the second channel connection structure.

In some embodiments, bonding the first connecting wafer and the device wafer further comprises: aligning and bonding one connecting wafer and the device wafer in a face-to-face manner to form a bonded structure; removing a portion of the bonded structure including the second substrate to expose the second channel layer and the second filling structure; and forming a channel plug on the second filling structure, the channel plug being in contact with the second channel layer.

In some embodiments, forming the channel plug comprises: removing a portion of the second filling structure to form a recess; forming a channel plug in the recess; and planarizing the channel plug.

In some embodiments, bonding the at least one connecting wafer and the device wafer further comprises: aligning and bonding the first connecting wafer and the device wafer in a face-to-face manner to form a two-deck bonded structure; removing a portion of the two-deck bonded structure including the second substrate to expose the second channel layer; forming a third channel connection structure in contact with the second channel layer, a width of the third channel connection structure being larger than the thickness of the second channel layer; and forming a third interconnect surface of the two-deck structure including a top surface of the third channel connection structure.

In some embodiments, bonding the at least one connecting wafer and the device wafer further comprises: aligning and bonding a second connecting wafer and the two-deck bonded structure in a face-to-face manner to form a three-deck bonded structure, such that the second channel connection structure in the second connecting wafer is in contact with the third channel connection structure in the two-deck structure.

Another aspect of the present disclosure provides a three-dimensional (3D) memory device, comprising: a lower portion including: a first alternating layer stack on a substrate, a first channel hole penetrating the first alternating layer stack, an epitaxial layer on a bottom of the first channel hole, a first channel layer on a sidewall of the first channel hole and in contact with the epitaxial layer, and a first channel connection structure in contact with the first channel layer; and a first upper portion including: a second channel hole penetrating a second alternating layer stack, a second channel layer on a sidewall of the second channel hole, and a second channel connection structure in contact with the second channel layer; wherein the first channel connection structure is bonded with the second channel connection structure.

In some embodiments, at least one of the first alternating dielectric stack and the second alternating dielectric stack comprises: a plurality of dielectric layer pairs stacked in a vertical direction, wherein each dielectric layer pair includes a first dielectric layer and a second dielectric layer that is different from the first dielectric layer.

In some embodiments, a width of the first channel connection structure is larger than a thickness of the first channel layer; a width of the second channel connection structure is larger than a thickness of the second channel layer; and the first channel connection structure is in direct contact with the second channel connection structure.

In some embodiments, the lower portion further comprises: a first functional layer covering a sidewall of the first channel hole; and a first filling structure in the first channel hole; wherein the first channel layer is sandwiched between the first functional layer and the first filling structure, and in contact with the first channel connection structure.

In some embodiments, the first functional layer comprises: a first barrier layer on the sidewall of the first channel hole and configured to block an outflow of electronic charges; a first storage layer on a surface of the first barrier layer and configured to store electronic charges during operation of the 3D memory device; and a first tunneling layer on a surface of the first storage layer and configured to tunnel electronic charges.

In some embodiments, the first upper portion comprises: a second functional layer covering a sidewall of the second channel hole; and a second filling structure filling the second channel hole; wherein the second channel layer is sandwiched between the second functional layer and the second filling structure, and in contact with the second channel connection structure.

In some embodiments, the second functional layer comprises: a second barrier layer on the sidewall of the second channel hole and configured to block an outflow of electronic charges; a second storage layer on a surface of the second barrier layer and configured to store electronic charges during operation of the 3D memory device; and a second tunneling layer on a surface of the second storage layer and configured to tunnel electronic charges.

In some embodiments, the first upper portion further includes a channel plug in the recess in contact with the second channel layer.

In some embodiments, the first upper portion further includes a third channel connection structure in contact with the second channel layer.

In some embodiments, the device further comprises: a second upper portion including: a third channel hole penetrating a third alternating layer stack, a third channel layer on a sidewall of the third channel hole, and a fourth channel connection structure in contact with the second channel layer; wherein the first upper portion is sandwiched between the second upper portion and the lower portion, and the fourth channel connection structure is bonded with the third channel connection structure.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a channel hole structure in a three-dimensional (3D) memory device, comprising:
    forming a device wafer including:
        forming a first channel hole penetrating a first alternating layer stack of a device wafer,
        forming an epitaxial layer on a bottom of the first channel hole, and
        forming a first channel layer on a sidewall of the first channel hole;
    forming at least one connecting wafer, wherein each connecting wafer includes a second channel hole penetrating a second alternating layer stack without an epitaxial layer on a bottom of the second channel hole; and
    bonding the at least one connecting wafer and the device wafer, such that a second channel layer on a sidewall of the second channel hole in each connecting wafer is electrically connected with the first channel layer in the device wafer.

2. The method of claim 1, further comprising:
    forming a first interconnect surface including a top surface of a first channel connection structure on the device wafer, a width of the first channel connection structure being larger than a thickness of the first channel layer;
    forming a second interconnect surface including a top surface of a second channel connection structure on the connecting wafer, a width of the second channel connection structure being larger than a thickness of the second channel layer; and
    bonding a first connecting wafer and the device wafer, including:
        aligning the first channel connection structure of the device wafer and the second channel connection structure of the first connecting wafer, and
        bonding the first interconnect surface of the device wafer to the second interconnect surface of the first connecting wafer such that the first channel connection structure is in direct contact with the second channel connection structure.

3. The method of claim 2, wherein forming the device wafer further comprises:

forming a first alternating dielectric stack and a first insulating connection layer on a first substrate;

forming the first channel hole penetrating the first insulating connection layer and the first alternating dielectric stack;

after forming the epitaxial layer on a bottom of the first channel hole, forming a first functional layer to cover a sidewall of the first channel hole;

forming the first channel layer covering the first functional layer and in contact with the epitaxial layer; and forming the first channel connection structure above the first functional layer, the first channel connection structure being in contact with the first channel layer.

4. The method of claim 3, wherein forming the first functional layer comprises:

forming a first barrier layer on the sidewall of the first channel hole for blocking an outflow of electronic charges;

forming a first storage layer on a surface of the first barrier layer for storing electronic charges during operation of the 3D memory device; and forming a first tunneling layer on a surface of the first storage layer for tunneling electronic charges.

5. The method of claim 4, wherein forming the first channel connection structure comprises:

forming a first channel connection layer on the first insulating connection layer, the first channel connection layer being in contact with the first channel layer;

forming a first filling structure to fill the first channel hole; and patterning the first channel connection layer to remove a portion of the first channel connection layer to expose the first storage layer, the remaining portion of the first channel connection layer that is above the first tunneling layer and the first channel layer being the first channel connection structure.

6. The method of claim 5, wherein forming the first interconnect surface comprises:

after patterning the first channel connection layer, removing an upper portion of the first storage layer; and refilling the first insulation connection layer and the first filling structure, such that top surfaces of the first insulation connection layer and the first filling structure are in level with the top surface of the first channel connection structure.

7. The method of claim 3, wherein forming each connecting wafer comprises:

forming a second alternating dielectric stack on a second substrate;

forming the second channel hole penetrating the second alternating dielectric stack;

forming a second functional layer to cover a sidewall of the second channel hole;

forming the second channel layer covering the second functional layer;

forming a second filling structure to fill the second channel hole; and forming the second channel connection structure above the second functional layer, the second channel connection structure being in contact with the second channel layer.

8. The method of claim 7, wherein forming the second functional layer comprises:

forming a second barrier layer on the sidewall of the second channel hole for blocking an outflow of electronic charges;

forming a second storage layer on a surface of the second barrier layer for storing electronic charges during operation of the 3D memory device; and forming a second tunneling layer on a surface of the second storage layer for tunneling electronic charges.

9. The method of claim 8, wherein forming each connecting wafer further comprises:

before forming the second channel connection structure, removing an upper portion of the first storage layer; and forming a second insulation connection layer to cover top surfaces of the second alternating dielectric stack and the second functional layer.

10. The method of claim 9, wherein forming the second channel connection structure comprises:

forming a second channel connection layer on the second insulating connection layer, the second channel connection layer being in contact with the second channel layer and insulated with the second storage layer; and patterning the second channel connection layer to remove a portion of the second channel connection layer, the remaining portion of the second channel connection layer that is above the second tunneling layer and the second channel layer being the second channel connection structure.

11. The method of claim 7, wherein bonding the first connecting wafer and the device wafer further comprises:

aligning and bonding one connecting wafer and the device wafer in a face-to-face manner to form a bonded structure;

removing a portion of the bonded structure including the second substrate to expose the second channel layer and the second filling structure; and forming a channel plug on the second filling structure, the channel plug being in contact with the second channel layer.

12. The method of claim 7, wherein bonding the at least one connecting wafer and the device wafer further comprises:

aligning and bonding the first connecting wafer and the device wafer in a face-to-face manner to form a two-deck bonded structure;

removing a portion of the two-deck bonded structure including the second substrate to expose the second channel layer;

forming a third channel connection structure in contact with the second channel layer, a width of the third channel connection structure being larger than the thickness of the second channel layer; and forming a third interconnect surface of the two-deck structure including a top surface of the third channel connection structure.

13. The method of claim 12, wherein bonding the at least one connecting wafer and the device wafer further comprises:

aligning and bonding a second connecting wafer and the two-deck bonded structure in a face-to-face manner to form a three-deck bonded structure, such that the second channel connection structure in the second connecting wafer is in contact with the third channel connection structure in the two-deck structure.

14. A three-dimensional (3D) memory device, comprising:

a lower portion including:

a first alternating layer stack on a substrate, a first channel hole penetrating the first alternating layer stack, an epitaxial layer on a bottom of the first channel hole, a first channel layer on a sidewall of the first channel hole and in contact with the epitaxial layer, and
a first channel connection structure in contact with the first channel layer; and
a first upper portion including:
a second channel hole penetrating a second alternating layer stack,
a second channel layer on a sidewall of the second channel hole, and
a second channel connection structure in contact with the second channel layer;
wherein the first channel connection structure is bonded with the second channel connection structure.

15. The device of claim 14, wherein:
a width of the first channel connection structure is larger than a thickness of the first channel layer;
a width of the second channel connection structure is larger than a thickness of the second channel layer; and
the first channel connection structure is in direct contact with the second channel connection structure.

16. The device of claim 15, wherein the lower portion further comprises:
a first functional layer covering a sidewall of the first channel hole, including:
a first barrier layer on the sidewall of the first channel hole and configured to block an outflow of electronic charges,
a first storage layer on a surface of the first barrier layer and configured to store electronic charges during operation of the 3D memory device, and
a first tunneling layer on a surface of the first storage layer and configured to tunnel electronic charges; and
a first filling structure in the first channel hole;
wherein the first channel layer is sandwiched between the first functional layer and the first filling structure, and in contact with the first channel connection structure.

17. The device of claim 16, wherein the first upper portion comprises:
a second functional layer covering a sidewall of the second channel hole, including:
a second barrier layer on the sidewall of the second channel hole and configured to block an outflow of electronic charges,
a second storage layer on a surface of the second barrier layer and configured to store electronic charges during operation of the 3D memory device, and
a second tunneling layer on a surface of the second storage layer and configured to tunnel electronic charges; and
a second filling structure filling the second channel hole;
wherein the second channel layer is sandwiched between the second functional layer and the second filling structure, and in contact with the second channel connection structure.

18. The device of claim 14, wherein the first upper portion further includes a channel plug in the recess in contact with the second channel layer.

19. The device of claim 14, wherein the first upper portion further includes a third channel connection structure in contact with the second channel layer.

20. The device of claim 19, further comprises:
a second upper portion including:
a third channel hole penetrating a third alternating layer stack,
a third channel layer on a sidewall of the third channel hole, and
a fourth channel connection structure in contact with the second channel layer;
wherein the first upper portion is sandwiched between the second upper portion and the lower portion, and the fourth channel connection structure is bonded with the third channel connection structure.

* * * * *